(12) United States Patent
Robello et al.

(10) Patent No.: US 9,991,114 B2
(45) Date of Patent: Jun. 5, 2018

(54) PHOTOLITHOGRAPHIC PATTERNING OF ELECTRONIC DEVICES

(71) Applicant: ORTHOGONAL, INC., Rochester, NY (US)

(72) Inventors: Douglas Robert Robello, Webster, NY (US); Terrence Robert O'Toole, Webster, NY (US); Frank Xavier Byrne, Webster, NY (US); Diane Carol Freeman, Pittsford, NY (US); Charles Warren Wright, Fairport, NY (US); Sandra Rubsam, Webster, NY (US); Kenneth Nicholas Boblak, Oakland, CA (US); Meng Zhao, Beijing (CN)

(73) Assignee: ORTHOGONAL, INC., Rochester, NY (US)

( * ) Notice: Subject to any disclaimer, the term of this patent is extended or adjusted under 35 U.S.C. 154(b) by 0 days. days.

(21) Appl. No.: 15/631,616

(22) Filed: Jun. 23, 2017

(65) Prior Publication Data

US 2017/0287694 A1    Oct. 5, 2017

Related U.S. Application Data

(63) Continuation-in-part of application No. PCT/US2015/000196, filed on Dec. 23, 2015.
(Continued)

(51) Int. Cl.
*H01L 21/00* (2006.01)
*H01L 21/027* (2006.01)
(Continued)

(52) U.S. Cl.
CPC ........ *H01L 21/0272* (2013.01); *C08F 214/18* (2013.01); *C08K 3/16* (2013.01); *C09D 4/00* (2013.01); *H01L 51/0011* (2013.01)

(58) Field of Classification Search
CPC .................. H01L 21/0272; H01L 51/0011
(Continued)

(56) References Cited

U.S. PATENT DOCUMENTS

| 5,250,395 A | 10/1993 | Allen et al. |
| 5,286,803 A | 2/1994 | Lindsay et al. |

(Continued)

FOREIGN PATENT DOCUMENTS

| WO | 2008/071662 A1 | 6/2008 |
| WO | 2015/120025 A1 | 8/2015 |

OTHER PUBLICATIONS

International Search Report for corresponding International Patent Application No. PCT/US2015/000196 dated Apr. 12, 2016, 3 pages.
(Continued)

*Primary Examiner* — Anthony Ho
(74) *Attorney, Agent, or Firm* — Merchant & Gould P.C.

(57) ABSTRACT

A method of patterning a device includes forming a fluorinated photopolymer layer over a device substrate. The photopolymer layer has a lower portion proximate the device substrate and an upper portion distal the device substrate. The fluorinated photopolymer layer includes a radiation-absorbing dye and a fluorinated photopolymer having a solubility-altering reactive group. The photopolymer layer is exposed to patterned radiation to form exposed and unexposed areas in accordance with the patterned radiation and a developed structure is formed by removing unexposed areas using a developing agent that includes a first fluorinated solvent. The lower portion of the exposed area of the photopolymer layer has a dissolution rate in the developing agent that is at least 5 times higher than a dissolution rate for the upper portion.

20 Claims, 12 Drawing Sheets

Related U.S. Application Data

(60) Provisional application No. 62/096,584, filed on Dec. 24, 2014.

(51) Int. Cl.
*H01L 51/00* (2006.01)
*C08K 3/16* (2006.01)
*C08F 214/18* (2006.01)
*C09D 4/00* (2006.01)

(58) Field of Classification Search
USPC .......................................................... 438/795
See application file for complete search history.

(56) References Cited

U.S. PATENT DOCUMENTS

| | | |
|---|---|---|
| 5,395,733 A | 3/1995 | Maemoto et al. |
| 5,650,456 A | 7/1997 | Yun et al. |
| 5,728,508 A | 3/1998 | Katsuya |
| 6,136,498 A | 10/2000 | Jagannathan et al. |
| 6,429,584 B2 | 8/2002 | Kubota |
| 7,632,630 B2 | 12/2009 | Mori et al. |
| 8,338,529 B2 | 12/2012 | Hoshino et al. |
| 8,871,545 B2 | 10/2014 | Lee et al. |
| 9,091,913 B2 | 7/2015 | Katz et al. |
| 9,298,088 B2 | 3/2016 | Robello et al. |
| 9,500,948 B2 | 11/2016 | Wright et al. |
| 9,541,829 B2 | 1/2017 | Robello et al. |
| 2002/0055059 A1 | 5/2002 | Nishimura et al. |
| 2003/0219675 A1 | 11/2003 | Montgomery et al. |
| 2004/0110091 A1 | 6/2004 | Fedynyshyn |
| 2010/0289019 A1 | 11/2010 | Katz et al. |
| 2011/0159252 A1 | 6/2011 | Ober et al. |
| 2012/0135206 A1 | 5/2012 | Haraguchi et al. |
| 2014/0127625 A1 | 5/2014 | Defranco et al. |
| 2014/0248565 A1 | 9/2014 | DeFranco et al. |
| 2014/0322656 A1 | 10/2014 | Wright et al. |
| 2014/0356789 A1 | 12/2014 | Wright et al. |
| 2015/0132699 A1 | 5/2015 | Robello et al. |
| 2015/0364685 A1 | 12/2015 | DeFranco et al. |
| 2016/0349614 A1 | 12/2016 | Wright et al. |

OTHER PUBLICATIONS

"LOR and PMGI Resists", MicroChem Data Sheet, 7 pages (2006).
Golden, J. et al., "Optimization of Bi-layer Lift-Off Resist Process", MicroChem Corp., 4 pages (2009).
Pending U.S. Appl. No. 15/501,092, filed Feb. 1, 2017, 70 pages.
Pending U.S. Appl. No. 15/501,109, filed Feb. 1, 2017, 35 pages.
Pending U.S. Appl. No. 15/501,116, filed Feb. 1, 2017, 39 pages.
Pending U.S. Appl. No. 15/501,128, filed Feb. 1, 2017, 56 pages.

PHOTOLITHOGRAPHIC PATTERNING OF ELECTRONIC DEVICES

CROSS-REFERENCE TO RELATED APPLICATIONS

This application is a Continuation-in-Part of PCT/US2015/000196, filed on Dec. 23, 2015 which claims the benefit of priority of U.S. Provisional Application No. 62/096,584, filed on Dec. 24, 2014 and which applications are incorporated herein by reference.

BACKGROUND

1. Field of the Disclosure

The present disclosure relates to patterning of organic, electronic and organic electronic devices. The disclosed methods and materials are particularly useful for lift-off patterning, e.g., for forming OLED devices.

2. Discussion of Related Art

Organic electronic devices may offer significant performance and price advantages relative to conventional inorganic-based devices. As such, there has been much commercial interest in the use of organic materials in electronic device fabrication. For example, displays based on organic light-emitting diode (OLED) technology have recently gained popularity and offer numerous advantages over many other display technologies. Although solution-deposited OLED materials have been developed, the highest-performing OLED devices typically use vapor-deposited thin films of active organic materials.

A key challenge for full-color OLED displays is patterning the array of red, green and blue pixels. For vapor-deposited OLEDs, a fine metal mask having openings corresponding to the fineness of the desired pattern is conventionally used.

However, a vapor deposited film builds up on the mask which may eventually narrow the mask openings or cause deforming stresses on the mask. Therefore, it is necessary to clean the mask after a certain number of uses, which is disadvantageous from the viewpoint of manufacturing costs. In addition, when a fine metal mask is increased in size to accommodate larger substrates, the positional accuracy of the mask openings becomes much more difficult, both from the standpoint of initial alignment and then maintaining the alignment during deposition due to thermal expansion issues. Positional accuracy may be improved to a degree by enhancing the stiffness of a frame of the mask, but this increase the weight of the mask itself causes other handling difficulties.

Thus, a need exists for cost-effective patterning of organic electronic devices such as OLED devices, and particularly those having pattern dimensions of less than about 100 µm. Even outside the field of organic electronics, there further exists a need for effective lift-off patterning structures that are simple to form, have low interaction with other device layers and have manufacturable processing times.

SUMMARY OF THE INVENTION

In accordance with the present disclosure, a method of patterning a device includes: forming over a device substrate a fluorinated photopolymer layer having a lower portion proximate the device substrate and an upper portion distal the device substrate, the fluorinated photopolymer layer comprising a radiation-absorbing dye and a fluorinated photopolymer having a solubility-altering reactive group; exposing the photopolymer layer to patterned radiation to form exposed and unexposed areas in accordance with the patterned radiation; and forming a developed structure by removing unexposed areas in a developing agent comprising a first fluorinated solvent, wherein the lower portion of the exposed area of the photopolymer layer has a dissolution rate in the developing agent that is at least 5 times higher than a dissolution rate for the upper portion.

In accordance with another aspect of the present disclosure, a method of patterning a device includes: forming over a device substrate a fluorinated photopolymer layer comprising a radiation-absorbing dye and a fluorinated photopolymer having a solubility-altering reactive group; exposing the photopolymer layer to patterned radiation to form an exposed photopolymer layer having exposed and unexposed areas in accordance with the patterned radiation; and contacting the exposed photopolymer layer with a developing agent to remove the unexposed areas, thereby forming a developed structure having a first pattern of photopolymer covering the device substrate and a complementary second pattern of uncovered substrate corresponding to the removed unexposed areas, the developing agent comprising a first fluorinated solvent, wherein the radiation provides a total exposure dose EXP (mJ/cm$^2$) at an exposure wavelength $\lambda_{exp}$, the photopolymer layer has a thickness $T_f$(µm), an absorptivity α (absorbance/µm) at $\lambda_{exp}$ and a speed point SP (mJ/cm$^2$) under conditions used for the exposing and contacting with the developing agent, and a processing factor, P, is in a range of 0.1 to 0.95 wherein P=[log(EXP/SP)]/(α*$T_f$).

In accordance with another aspect of the present disclosure, a fluorinated photopolymer composition includes: a fluorinated solvent; a radiation-absorbing dye; and a fluorinated photopolymer having a fluorine content of at least 10% by weight comprising one or more solubility-altering reactive groups, wherein a film formed from the composition has, after removal of the fluorinated solvent, an absorptivity of at least 0.3 absorbance units per µm of film thickness when measured at 365 nm, 405 nm or 436 nm.

Methods and compositions disclosed herein can be used to form undercut photopolymer structures that are easily lifted off, thereby making them very useful for patterning devices. The methods and materials enable a wide processing latitude for making such structures. Fluorinated solvents and materials provide gentle processing conditions, compatible with organic electronic and bioelectronic devices. The rapid processing and low toxicity of the methods and materials make the disclosed systems also very useful for patterning non-organic electronic devices such as MEMS.

DETAILED DESCRIPTION

Figure 1:
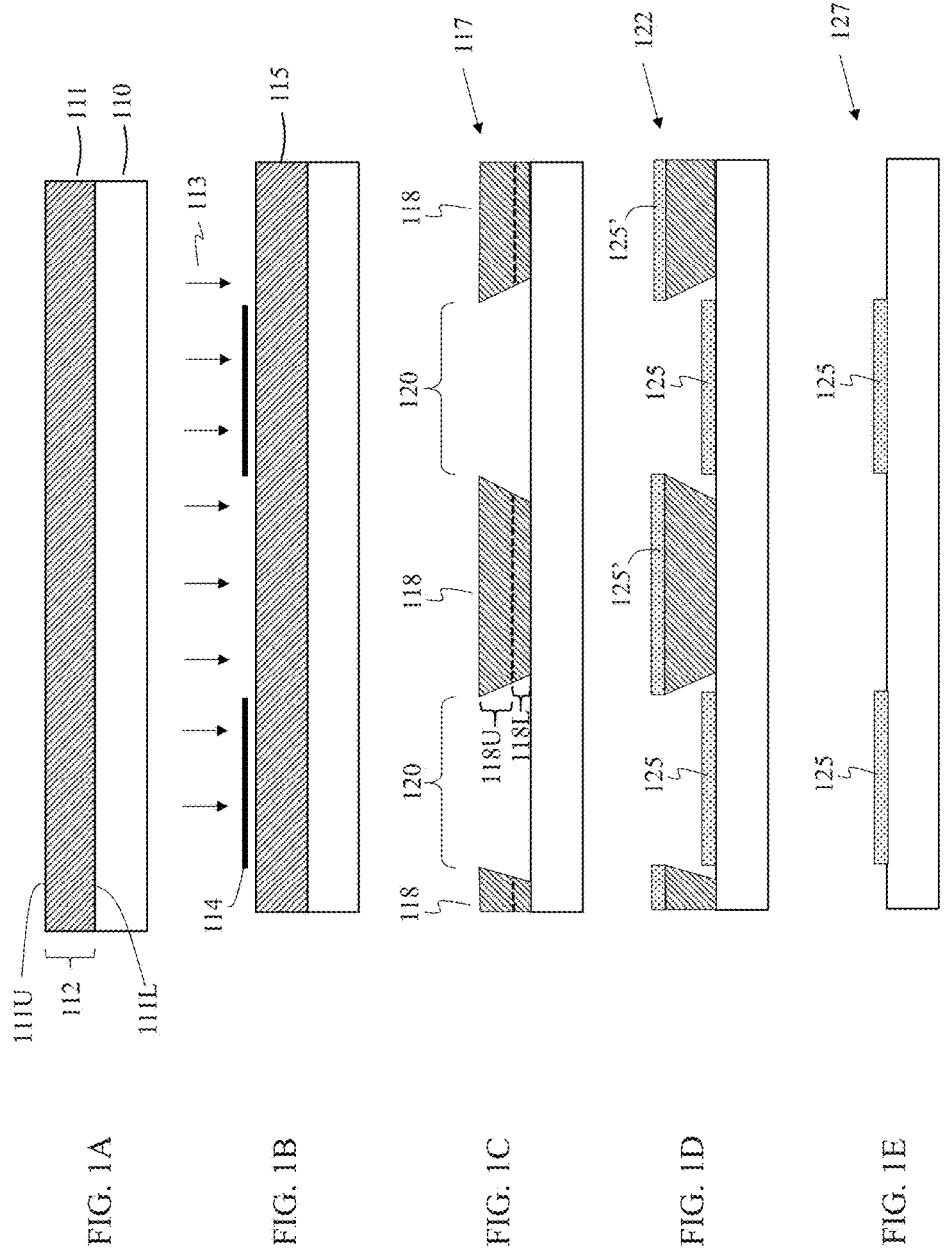
FIG. 1 is a series (1A-1E) of cross-sectional views depicting various stages in the formation of a patterned device structure according to an embodiment of the present disclosure.

It is to be understood that the attached drawings are for purposes of illustrating the concepts of the disclosure and may not be to scale.

In an embodiment, "orthogonal" resist structures and processing agents are used that are compatible with sensitive electronic devices and materials such as OLED devices and materials, i.e., they are chosen to have low interaction with sensitive device layers that are not intended to be dissolved or otherwise damaged. Conventional photoresist materials typically use harsh organic solvents and often strongly caustic developers that can easily damage one or more layers of an OLED device. Particularly useful orthogonal photoresist structures and processing agents include fluorinated polymers or molecular solids and fluorinated solvents. Some orthogonal photoresist structures and systems are disclosed in U.S. patent application Ser. Nos. 12/864,407, 14/113,408, 14/291,692, 14/335,406, 14/335,476, 14/539,574, and PCT Application No. PCT/US2015/014425, the contents of which are incorporated by reference. The developed photoresist structures of the present disclosure typically have an undercut profile, which can be advantageous in so-called "lift-off" photolithographic patterning. Such photoresist structures may also be referred to herein as lift-off structures. In an embodiment, the photoresist structure is a single layer structure, but in an alternative embodiment, the photoresist structure has a bilayer or multilayer structure. Orthogonality can be tested by, for example, immersion of a device comprising the material layer of interest into a target composition prior to operation (e.g., into a coating solvent, a developing agent, a lift-off agent, or the like). The composition is orthogonal if there is no serious reduction in the functioning of the device.

Certain embodiments disclosed in the present disclosure are particularly suited to the patterning of solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronics materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix. The present disclosure is particularly directed towards patterning of OLED devices, but the concepts and methods disclosed herein can be applied to other electronic, optical, organic electronic or bioelectronic devices.

Photopolymer Structures and Device Patterning

FIG. 1 shows a series of cross-sectional views of the formation and use of photopolymer structures of the present disclosure. In FIG. 1A, a fluorinated photopolymer layer 111 is provided over a device substrate 110. The lower surface 111L of the fluorinated photopolymer layer is provided proximate the device substrate, whereas the upper surface 111U is distal the device substrate. The distance between the lower surface 111L and upper surface 111U defines layer thickness 112. A device substrate may optionally be a multilayer structure having a rigid or flexible support and one or more additional patterned or non-patterned layers. Support materials include, but are not limited to, plastics, metals, glasses, ceramics, composites and fabrics. In an embodiment, the device substrate is for a MEMS device. In an embodiment, the device substrate includes one or more layers of one or more active organic materials that may optionally be in direct contact with the photopolymer layer. One non-limiting example of such a device includes an OLED device, e.g., an active matrix, passive matrix, area color or solid-state lighting OLED device, but the device may instead be an organic photovoltaic, an OTFT, a touch sensor, a chemical sensor, a bioelectronic or medical device, or the like.

In an embodiment, the fluorinated photopolymer layer includes a copolymer comprising a first repeating unit having a fluorine-containing group, a second repeating unit having a solubility-altering reactive group, and a third repeating unit having a radiation-absorbing dye. Examples of photosensitive fluorinated materials include those disclosed in U.S. patent application Ser. Nos. 12/864,407, 14/113,408, 14/291,692, 14/335,406, 14/335,476, 14/539, 574, and PCT Application No. PCT/US2015/014425, the contents of which are incorporated by reference. In an embodiment, the photosensitive fluorinated material is a negative working photopolymer provided from a composition including a fluorinated solvent, e.g., a hydrofluoroether. The fluorinated photopolymer composition may be applied to a substrate using any method suitable for depositing a photosensitive liquid material. For example, the composition may be applied by spin coating, curtain coating, bead coating, bar coating, spray coating, dip coating, gravure coating, ink jet, flexography or the like. Alternatively, the photopolymer can be applied to the substrate by transferring a preformed fluorinated photopolymer layer from a carrier sheet, for example, by lamination transfer using heat, pressure or both.

In an embodiment, the fluorinated photopolymer layer further includes a photoacid generator compound or a tertiary amine compound or both, which are optionally covalently attached to the copolymer or to another polymer to reduce diffusion of such compounds to the device substrate. In an embodiment, the solubility-altering reactive group is an acid- or alcohol-forming precursor group. In an embodiment, the radiation-absorbing dye acts as a sensitizing dye. In an embodiment, rather than or in addition to having the radiation-absorbing dye provided as a third repeating unit of the copolymer, the radiation-absorbing dye may be provided as a small molecule material or attached to another polymer.

In FIG. 1B, the photopolymer layer is exposed to patterned radiation within the spectral sensitivity range of the photopolymer (e.g., light in a range of 300 nm to 450 nm), thereby forming an exposed photopolymer layer 115. The patterned radiation forms areas of differential developability due to some chemical or physical change caused by the radiation exposure, in particular, to the reacted solubility-altering reactive groups. Patterned radiation can be produced by many methods, for example, by directing exposing radiation 113 through a photomask 114 and onto the photopolymer layer as shown in FIG. 1B. Photomasks are widely used in photolithography and often include a patterned layer of chrome that blocks light. Thus, the exposed photopolymer layer 115 has one or more exposed areas corresponding to openings in the photomask where light is not blocked and one or more unexposed areas corresponding to light-blocking areas of the photomask. The photomask may be in direct contact or in proximity. When using a proximity exposure, it is preferred that the light has a high degree of collimation if high resolution features are desired. Alternatively, the patterned light can be produced by a projection exposure device. In addition, the patterned light can be from a laser source that is selectively directed to certain portions of the photopolymer layer.

In FIG. 1C, a developed photopolymer structure is formed that includes a first pattern of photopolymer 118 having an undercut structure. This can be done by contacting the exposed photopolymer layer with a developing agent. During development, unexposed portions of the exposed photopolymer layer are removed in accordance with the patterned light thereby forming a developed structure 117 having a first pattern of photopolymer 118 covering the device substrate (corresponding to the exposed portions) and a complementary second pattern 120 of uncovered substrate corresponding to the unexposed portions. By "uncovered substrate", it is meant that the surface of the substrate is substantially exposed or revealed to a degree that it may optionally be subjected to further treatments. Contacting the exposed photopolymer layer can be accomplished by immersion into the developing agent or by coating it with the developing agent in some way, e.g., by spin coating or spray coating. The contacting can be performed multiple times if necessary. In an embodiment, the developing agent includes at least 50% by volume of one or more fluorinated solvents. In an embodiment, the developing agent includes at least 90% by volume of one or more hydrofluoroether solvents. If necessary, a brief cleaning step may be used to remove residue in the uncovered substrate areas, e.g., oxygen plasma, argon plasma, ozone or the like.

In order to reliably form an undercut structure that can be easily lifted-off, the photopolymer, radiation exposure and developing conditions are selected to meet the following parameters and formula. In particular, the radiation is selected to provide a total exposure dose EXP (mJ/cm$^2$) at an exposure wavelength $\lambda_{exp}$. The photopolymer layer is selected to have a thickness $T_f$ (μm), an absorptivity α (absorbance/μm) at $\lambda_{exp}$ and a speed point SP (mJ/cm$^2$, discussed below) under conditions used for the exposing and contacting with the developing agent. Further, the above parameters are selected so that a processing factor, P, is in a range of 0.1 to 0.95 wherein P is defined by Equation (1).

$$P=[\log(EXP/SP)]/(\alpha*T_f) \qquad \text{Equation (1)}$$

Figure 8:
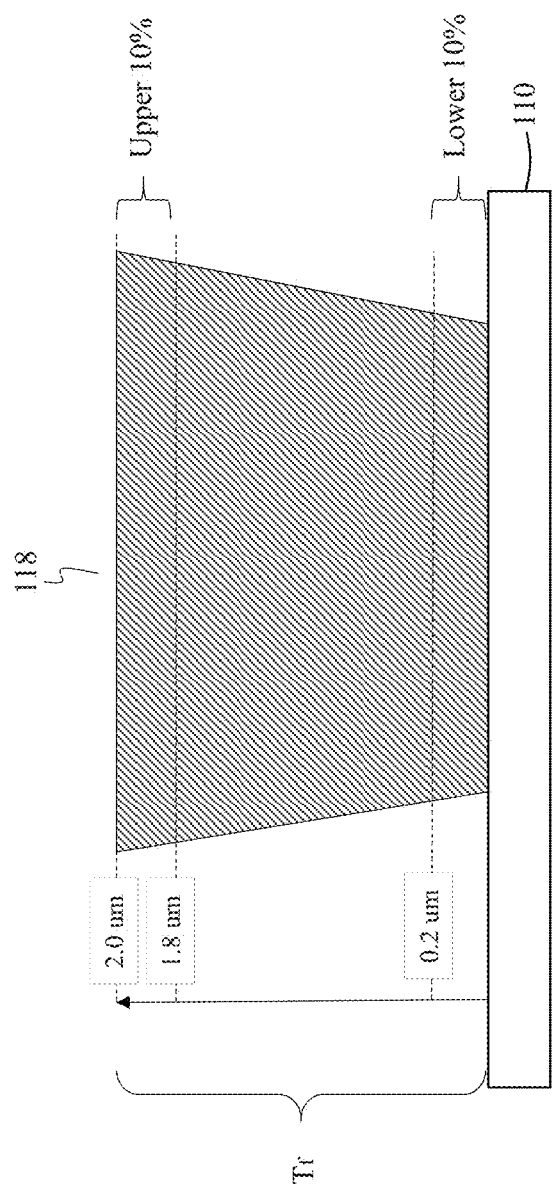
FIG. 8 is a cross-sectional view depicting upper and lower portions of a patterned photopolymer.

As seen in FIG. 1C, a lower portion of the first pattern of photopolymer 118L (proximate the underlying device substrate) is more soluble in the developing agent and the lift-off agent than an upper portion 118U. Not only can this create an undercut in development, the more soluble portion can be relied upon to provide facile lift-off in subsequent steps. In an embodiment, the lower portion 118L has a dissolution rate in the developing agent or lift-off agent that is at least 5 times higher than a dissolution rate for the upper portion 118U. In an embodiment, the lower 10% (in terms of film thickness) of the patterned photopolymer 118 has a dissolution rate that is at least 5 times higher than that of the upper 10% of the patterned photopolymer in the developing agent or the lift-off agent. For example, as shown in FIG. 8, if a patterned photopolymer had a total thickness, $T_f$, of 2.0 μm, the lower 10% would correspond to the portion of the photopolymer from lower surface proximate the device substrate up to 0.2 μm of the film thickness. The upper 10% would correspond to the portion of photopolymer between 1.8 μm and 2.0 μm away from the lower surface, i.e., the portion of photopolymer 0.2 μm deep relative to the upper surface. In an embodiment, P is in a range of 0.1 to 0.95, alternatively, 0.3 to 0.95, alternatively 0.5 to 0.95, alternatively 0.5 to 0.92, or alternatively 0.6 to 0.92.

In an embodiment, $T_f$ is at least 1.0 μm and α is at least 0.2 absorbance units per micron. Preferably, $T_f$ is at least 1.5 μm and α is at least 0.3 absorbance units per micron. In an embodiment $T_f$ is at least 1.5 μm and α is at least 0.5 absorbance units per micron.

In FIG. 1D an active material layer 125/125' is provided over the device to form an intermediate structure 122, e.g., by vapor deposition, sputtering or other deposition methods that are directional, or that otherwise allow sidewalls of the patterned photopolymer 118 to remain at least partially uncovered. Some portions of the active material are deposited over at least a portion the uncovered substrate (125) and other portions of the active material are deposited over the first pattern of photopolymer (125').

In FIG. 1E, the intermediate structure is contacted with a lift-off agent that is also orthogonal relative to the underlying device substrate, e.g., a lift-off agent having a fluorinated solvent such as a hydrofluoroether. In an embodiment, the lower portion 118L provides facile lift-off in the lift-off agent due to its higher dissolution rate relative to upper portion 118U and lowers the overall volume burden on the process. That is, the entire layer 118 does not need to be dissolved or removed, just the lower fraction. The lift-off step removes active material deposited over the first pattern of photopolymer, leaving behind a patterned device structure 127 having a pattern of active material 125 deposited over the device substrate.

In an alternative embodiment, rather than depositing material 125, or prior to such deposition, an intermediate structure can be formed by etching or otherwise modifying at least a portion of the uncovered substrate, followed by removal of the photopolymer structure 118.

In another embodiment, the photopolymer structure includes an intervening fluoropolymer layer between the device substrate and the fluorinated photopolymer layer. In an embodiment, the intervening fluoropolymer layer is vapor deposited (e.g., if a molecular solid) or coated from a composition including a fluorinated solvent including, but not limited to, a hydrofluoroether or a perfluorinated solvent.

This layer is designed to be chemically orthogonal relative to the underlying device substrate. Some layer mixing may occur. In an embodiment, the dissolution rate of the intervening fluoropolymer layer in the coating solvent of the fluorinated photopolymer composition is less than 50 nm/sec, alternatively less than 10 nm/sec. In an embodiment, the intervening fluoropolymer layer is substantially unaltered chemically when exposed to the patterned radiation. It does not require photo-active elements such as photoacid generators or reactive groups that may, in some cases, harm the underlying device. The intervening fluoropolymer layer is further designed to be readily soluble in a fluorinated or other orthogonal solvent to enable patterning and subsequent rapid lift-off or removal. After, or concurrent with, development of the fluorinated photopolymer, a portion of the intervening fluoropolymer is removed (e.g. by dissolution in a fluorinated solvent) to form a pattern of uncovered substrate corresponding to the pattern of unexposed portions of the fluorinated photopolymer.

The intervening fluoropolymer can provide an extra layer of protection between the fluorinated photopolymer and the device substrate. Although still generally much less harmful than traditional photoresists, the fluorinated photopolymer may in certain embodiments include a coating solvent or mobile agents (e.g. PAG compound or quencher compound) that may adversely affect the underlying device substrate. The intervening fluoropolymer can prevent or reduce this unwanted interaction. In an embodiment, the intervening fluoropolymer includes an acid-quenching group such as a trialkyl amine. Herein the terms acid quenching and acid scavenging are used interchangeably.

For many applications such as OLED devices, the active material may be a single layer or multiple layers. In the case of passive matrix OLED, the undercut structure of the photopolymer 118 is analogous to so-called cathode separation structures that are well known in the art. Such cathode separation structures are typically left in place in the finished device. However, the methods of the present disclosure allow formation of a cathode separation structure (patterned photopolymer 118) that can be easily removed by lift off which opens up new form factors and features.

Figure 14A:
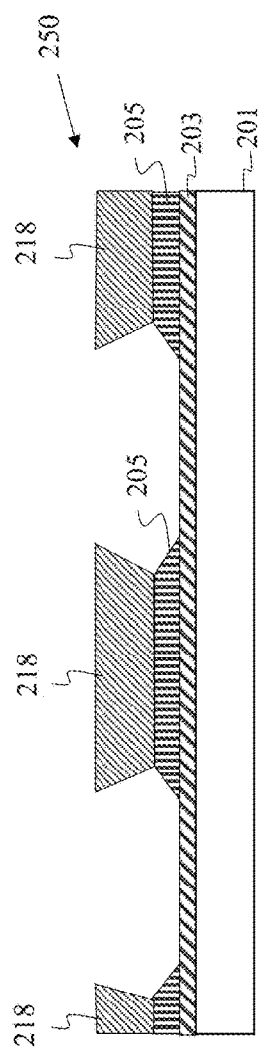
FIG. 14 is a series (14A-14C) of cross-sectional views depicting various stages in the formation of a passive matrix OLED device according to an embodiment of the present disclosure.

In an embodiment, a passive matrix OLED can be formed as shown in FIG. 14. FIG. 14A shows a cross section of a passive matrix OLED substructure 250, which includes a substrate 201, a first electrode 203, an optional base layer 205 and a patterned photopolymer 218 having an undercut profile. Substrate 201 can have a wide variety of properties. For example, it can be formed from glass or plastic materials or have a multilayer structure. It can be flexible or rigid. It can be transparent, opaque or colored. The first electrode in passive matrix OLED devices is typically, but not necessarily, the anode and patterned into stripes. The present cross-section is along one of the first electrode stripes. The first electrode includes an electrically conductive material. In an embodiment, the first electrode is at least partially transparent, and includes ITO, IZO, conductive polymer, or a thin metal film. It is common for passive matrix substructures to include a base layer 205 patterned in registration with the cathode separator, i.e., the patterned photopolymer 218. The base layer can help define the pixel pattern and reduce the occurrence of shorting. The base layer can be inorganic, but is commonly organic, e.g., a conventional photoresist or a patterned polymer. The patterned photopolymer 218 can be formed using the same materials and methods as discussed above with respect to patterned photopolymer 118. Not shown in the cross-sectional view, the patterned photopolymer 218 is typically formed in lines that run orthogonal to the direction of the first electrode lines. The passive matrix substructure may be similar to those described in U.S. Pat. No. 6,429,584, which is incorporated herein by reference, with the exception of replacing conventional cathode separation structures or ramparts with the patterned photopolymer of the present disclosure.

Figure 14B:
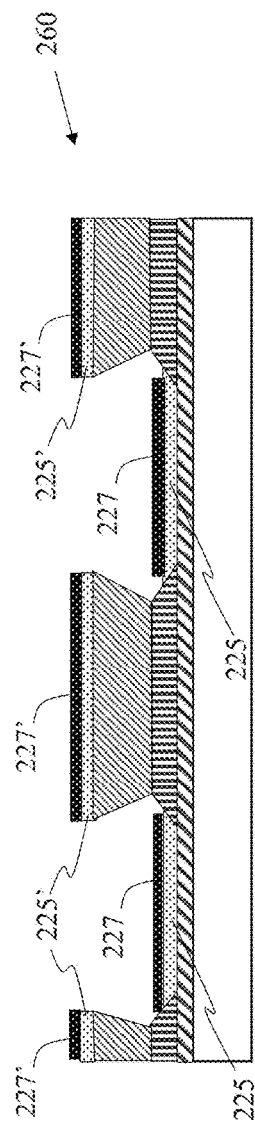
Figure 14C:
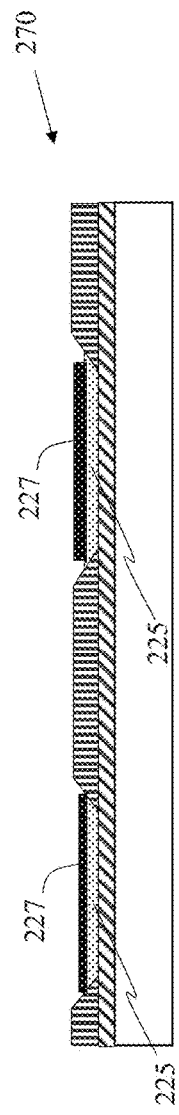

In FIG. 14B, an OLED stack 225 and second electrode 227 are deposited, e.g., by vapor deposition, to form intermediate passive matrix OLED structure 260. As is well known in the art, an OLED stack typically contains a multilayer arrangement of charge transporting and emissive materials, most of which contain organic compounds. The second electrode is typically, but not necessarily, the cathode and may include a conductive opaque metal. Alternatively, transparent or partially transparent conductors may be used instead. In FIG. 14C, patterned photopolymer 218 is removed by lift-off, as described above with respect to photopolymer 118. In this lift-off step, the overlying OLED stack 225' and second electrode 227' are also removed forming a passive matrix OLED device 270 that is substantially thinner than the intermediate passive matrix OLED structure 260. Although the sensitive OLED materials are mostly covered by the cathode, there can still be attack at pin-holes or edges using conventional solvents—the fluorinated lift-off solvents of the present disclosure are more compatible with OLED materials and also very effective at achieving rapid lift-off.

In embodiments described herein, a fluorinated photopolymer layer or intervening fluoropolymer layer may be coated or processed (e.g., development or lift-off) using a fluorinated solvent. Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1, 1,1,2,3, 4,4,5,5,6,6,6-dodecafluoro-2-trifluoromethyl-hexane (HFE-7500 aka Novec™ 7500), 1,1,1,2,3,3-hexafluoro-4-(1,1,2,3, 3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxy)benzene (HFE-978m), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4,4-pentafluorotetrahydro-5-methoxy-2,5-bis [1,2,2,2-tetrafluoro-1-(trifluoromethyl) ethyl]-furan (HFE-7700 aka Novec™ 7700) and 1,1,1,2,2,3,3,4,4,5,5,6,6-tridecafluorooctane-propyl ether (TE60-C3).

Mixtures of fluorinated solvents may optionally be used, e.g., as disclosed in U.S. patent application Ser. No. 14/260, 666, the entire contents of which are incorporated by reference herein.

The term "fluoropolymer" herein includes not only high molecular weight, long chain fluorinated materials, but also lower molecular weight oligomers, macrocyclic compounds such as fluorinated calixarene derivatives and other highly fluorinated hydrocarbons having at least 15 carbon atoms. In an embodiment, the molecular weight of the fluoropolymer is at least 750. In an embodiment, the fluoropolymer is soluble in one or more fluorinated solvents. Fluorinated photopolymers preferably have a total fluorine content by weight of at least 10%, alternatively in a range of 15% to 75%, or alternatively 30% to 75%, or alternatively 30% to 55%.

When an intervening fluoropolymer is provided, the fluorine content of the intervening fluoropolymer may be in a range as described above. In an embodiment, the fluorine content of the intervening fluoropolymer is in a range of 40% to 75% by weight. In an embodiment, the fluorine content of the intervening fluoropolymer is higher than the fluorine content of the fluorinated photopolymer. Some non-limiting examples of commercially available materials useful as the intervening fluoropolymer include Cytop, Teflon AF and Hyflon AD.

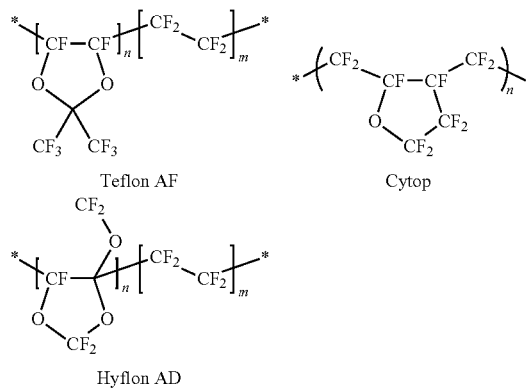

In an embodiment, the non-inherently photosensitive fluoropolymer is a copolymer comprising a fluorine-containing group and a non-photosensitive functional group. The non-photosensitive functional group may improve film adhesion, improve coatability, adjust dissolution rate, absorb light, improve etch resistance and the like. In an embodiment, the non-photosensitive functional group is a non-fluorine-containing aromatic or aliphatic hydrocarbon that may optionally be substituted, for example, with oxygen-containing groups such as ethers, alcohols, esters, and carboxylic acids.

In an embodiment, a fluorinated photopolymer composition includes a fluorinated solvent, a copolymer comprising at least two distinct repeating units, including a first repeating unit having a fluorine-containing group, a second repeating unit having a solubility-altering reactive group and a radiation-absorbing dye that may optionally be provided as part of a third repeating unit of the copolymer. The copolymer is suitably a random copolymer, but other copolymer types may be used, e.g., block copolymers, alternating copolymers, and periodic copolymers. The term "repeating unit" herein is used broadly herein and simply means that there is more than one unit. The term is not intended to convey that there is necessarily any particular order or structure with respect to the other repeating units unless specified otherwise. When a repeating unit represents a low mole % of the combined repeating units, there may be only one such unit on a polymer chain.

The copolymer may be optionally blended with one or more other polymers, preferably other fluorine-containing polymers. The fluoropolymer may optionally be branched, which may in certain embodiments enable lower fluorine content, faster development and stripping rates, or incorporation of groups that otherwise may have low solubility in a fluorinated polymer.

In an embodiment, at least one of the specified repeat units is formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. Similarly, a precursor polymer containing an alcohol can be reacted with a suitably derivatized glycidyl moiety to form an acid-catalyzed cross-linkable (epoxy-containing) repeating unit as the solubility-altering reactive group. In another example, a polymer containing a suitable leaving group such as primary halide can be reacted with an appropriate compound bearing a phenol moiety to form the desired repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the repeating units of the copolymer are formed directly by polymerization of the appropriate monomers, rather than by attachment to an intermediate polymer. Although many of the embodiments below refer to polymerizable monomers, analogous structures and ranges are contemplated wherein one or more of the repeating units are formed by attachment of the relevant group to an intermediate polymer as described above.

In an embodiment, the fluorinated photopolymer material includes a copolymer formed at least from a first monomer having a fluorine-containing group, a second monomer having a solubility-altering reactive group, and optionally, a third monomer having a radiation-absorbing dye. Additional monomers may optionally be incorporated into the copolymer. The first monomer is one capable of being copolymerized with the second monomer and has at least one fluorine-containing group. In an embodiment, at least 70% of the fluorine content of the copolymer (by weight) is derived from the first monomer. In another embodiment, at least 85% of the fluorine content of the copolymer (by weight) is derived from the first monomer.

The first monomer includes a polymerizable group and a fluorine-containing group. Some non-limiting examples of useful polymerizable groups include acrylates (e.g. acrylate, methacrylate, cyanoacrylate and the like), acrylamides, vinylenes (e.g., styrenes), vinyl ethers and vinyl esters. The fluorine-containing group of the first monomer or the first repeating unit is preferably an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. Throughout this disclosure, unless otherwise specified, any use of the term alkyl includes straight-chain, branched and cyclo-alkyls. In an embodiment, the first monomer does not contain substantial protic or charged substituents, such as hydroxy, carboxylic acid, sulfonic acid or the like.

In an embodiment, the first monomer has a structure according to Formula (1):

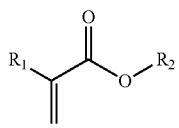

Formula (1)

In formula (1), $R_1$ represents a hydrogen atom, a cyano group, a methyl group or an ethyl group. $R_2$ represents a fluorine-containing group, in particular, a substituted or unsubstituted alkyl group having at least 5 fluorine atoms, preferably at least 10 fluorine atoms. In an embodiment, the alkyl group is a cyclic or non-cyclic hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter is 1H,1H,2H,2H-perfluorooctyl methacrylate ("FOMA").

A combination of multiple first monomers or first repeating units having different fluorine-containing groups may be used. The total mole ratio of first monomers relative to all of the monomers of the copolymer may be in a range of 5 to 80%, or alternatively 10 to 70%, or alternatively 20 to 60%.

The second monomer is one capable of being copolymerized with the first monomer. The second monomer includes a polymerizable group and a solubility-altering reactive group. Some non-limiting examples of useful polymerizable groups include those described for the first monomer.

In an embodiment, the solubility-altering reactive group of the second monomer or second repeating unit is an acid-forming precursor group. Upon exposure to light, the acid-forming precursor group generates a polymer-bound acid group, e.g., a carboxylic or sulfonic acid. This can drastically change its solubility relative to the unexposed regions thereby allowing development of an image with the appropriate solvent. In an embodiment, the developing agent includes a fluorinated solvent that selectively dissolves unexposed areas. In an embodiment, a carboxylic acid-forming precursor is provided from a monomer in a weight percentage range of 4 to 40% relative to the copolymer, or alternatively in a weight percentage range of 10 to 30%.

One class of acid-forming precursor groups includes the non-chemically amplified type (i.e., non-acid catalyzed). An example of a second monomer with such a group is 2-nitrobenzyl methacrylate. The non-chemically amplified precursor group may directly absorb light to initiate de-protection of the acid-forming groups. Alternatively, a sensitizing dye may be added to the composition whereby the sensitizing dye absorbs light and forms an excited state capable of directly sensitizing or otherwise initiating the de-protection of acid-forming precursor groups. The sensitizing dye may be added as a small molecule or it may be attached or otherwise incorporated as part of the copolymer. For example, the third repeating unit's radiation-absorbing dye may be a sensitizing dye. Unlike chemically amplified formulations that rely on generation of an acid (see below), non-chemically amplified photopolymers may sometimes be preferred when a photopolymer is used in contact with an acid-sensitive or acid-containing material.

A second class of acid-forming precursor groups includes the chemically amplified type. This typically requires addition of a photo-acid generator (PAG) to the photopolymer composition, e.g., as a small molecule additive to the solution.

The PAG may function by directly absorbing radiation (e.g. UV light) to cause decomposition of the PAG and release an acid. Alternatively, a sensitizing dye may be added to the composition whereby the sensitizing dye absorbs radiation and forms an excited state capable of reacting with a PAG to generate an acid. The sensitizing dye may be added as a small molecule, attached to or otherwise incorporated as part of the copolymer, or provided on another polymer that is added to the composition. The radiation-absorbing dye of the present disclosure may optionally also act as a sensitizing dye. The third repeating unit's radiation-absorbing dye may be a sensitizing dye. In an embodiment, the sensitizing dye (either small molecule or attached) is fluorinated. In an embodiment, the sensitizing dye may be provided in a range of 0.5 to 10% by weight relative to the total copolymer weight. The photochemically generated acid catalyzes the de-protection of acid-labile protecting groups of the acid-forming precursor. In some embodiments, chemically amplified photopolymers can be particularly desirable since they enable the exposing step to be performed through the application of relatively low energy UV light exposure. This is advantageous since some active organic materials useful in applications to which the present disclosure pertains may decompose in the presence of UV light, and therefore, reduction of the energy during this step permits the photopolymer to be exposed without causing significant photolytic damage to underlying active organic layers. Also, reduced light exposure times improve the manufacturing throughput of the desired devices. Exposed fluorinated photopolymers using PAG compounds sometimes require a post exposure bake ("PEB") to fully activate the acid-forming groups.

Examples of acid-forming precursor groups that yield a carboxylic acid include, but are not limited to: A) esters capable of forming, or rearranging to, a tertiary cation, e.g., t-butyl ester, t-amyl ester, 2-methyl-2-adamantyl ester, 1-ethylcyclopentyl ester, and 1-ethylcyclohexyl ester; B) esters of lactone, e.g., γ-butyrolactone-3-yl, γ-butyrolactone-2-yl, mevalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters, E) alpha-cyclic ether esters; and F) MEEMA (methoxy ethoxy ethyl methacrylate) and other esters which are easily hydrolyzable because of anchimeric assistance. In an embodiment, the second monomer comprises an acrylate-based polymerizable group and a tertiary alkyl ester acid-forming precursor group, e.g., t-butyl methacrylate ("TBMA"), 1-ethylcyclopentyl methacrylate ("ECPMA") or 3-methyl-1-(tetrahydropyran-2-yl)-but-3-en-2-one ("THPMA").

In an embodiment, the solubility-altering reactive group is an hydroxyl-forming precursor group (also referred to herein as an "alcohol-forming precursor group"). The hydroxyl-forming precursor includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the deprotection of the hydroxyl-forming precursor group, thereby forming a polymer-bound alcohol (hydroxyl group). This significantly changes its solubility relative to the unexposed regions thereby allowing development of an image with the appropriate solvent (typically fluorinated). In an embodiment, the developing agent includes a fluorinated solvent that selectively dissolves unexposed areas. In an alternative embodiment, the developing agent includes a polar solvent that selectively dissolves the exposed areas. In an embodiment, an hydroxyl-forming precursor is provided from a monomer in a weight percentage range of 4 to 40% relative to the copolymer.

In an embodiment, the hydroxyl-forming precursor has a structure according to Formula (2):

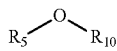

Formula (2)

wherein $R_5$ is a carbon atom that forms part of the second repeating unit or second monomer, and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4). The * symbol in the structures below simply denotes attachment to the oxygen atom of Formula 2.

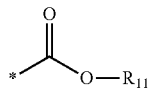
(AL-1)

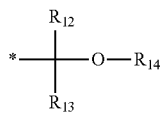
(AL-2)

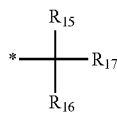
(AL-3)

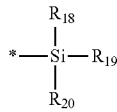
(AL-4)

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

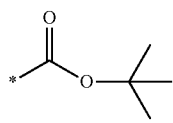
AL-1-1

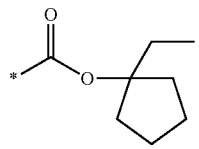
AL-1-2

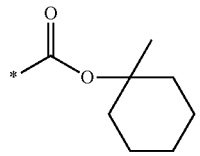
AL-1-3

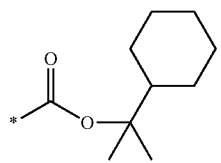
AL-1-4

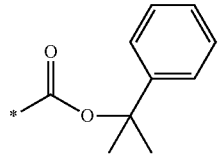
AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

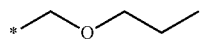
AL-2-1

AL-2-2

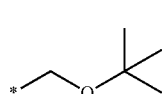
AL-2-3

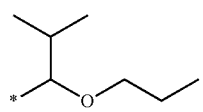
AL-2-4

AL-2-5

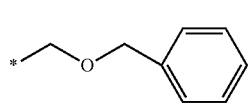
AL-2-6

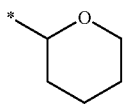

AL-2-7

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1

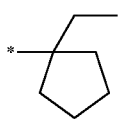

AL-3-2

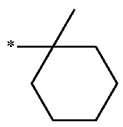

AL-3-3

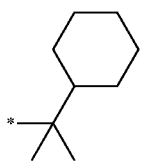

AL-3-4

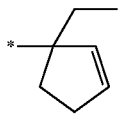

AL-3-5

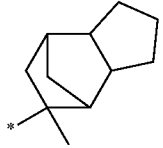

AL-3-6

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In an embodiment, the alcohol-forming second monomer is 2-(trimethylsilyloxy)ethyl methacrylate ("TMSOEMA"), 2-tert-butoxyethyl methacrylate ("TBOEMA"), or 2-propenoic acid, 2-methyl-, 2-[(tetrahydro-2H-pyran-2-yl)oxy]ethylester ("THPOEMA")

In an embodiment, the solubility-altering reactive group is a cross-linkable group, e.g., an acid-catalyzed cross-linkable group or a photo cross-linkable (non-acid catalyzed) group. Photo cross-linkable groups typically have at least one double bond so that when the group forms an excited state (either by direct absorption of light or by excited state transfer from a sensitizing dye), sets of double bonds from adjacent polymer chains crosslink. In an embodiment, the photo cross-linkable group (not catalyzed) comprises a cinnamate that may optionally further include fluorine-containing substituents. Some non-limiting examples of polymerizable monomers including such cinnamates are shown below.

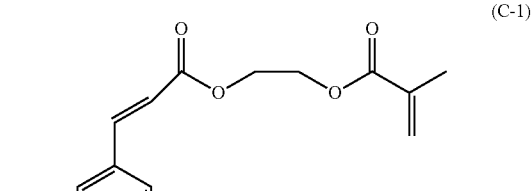

(C-1)

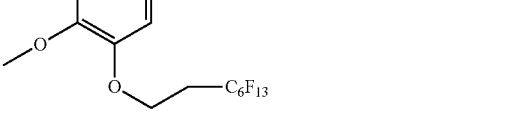

(C-2)

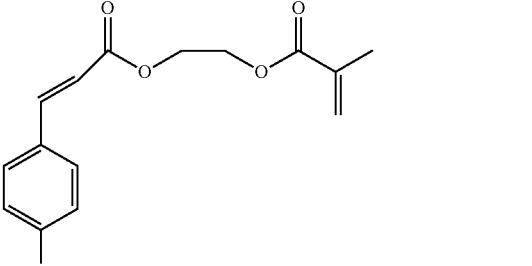

(C-3)

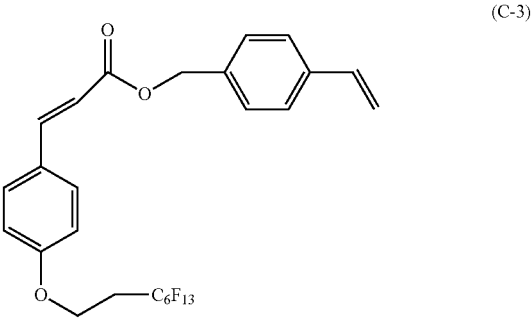

(C-4)

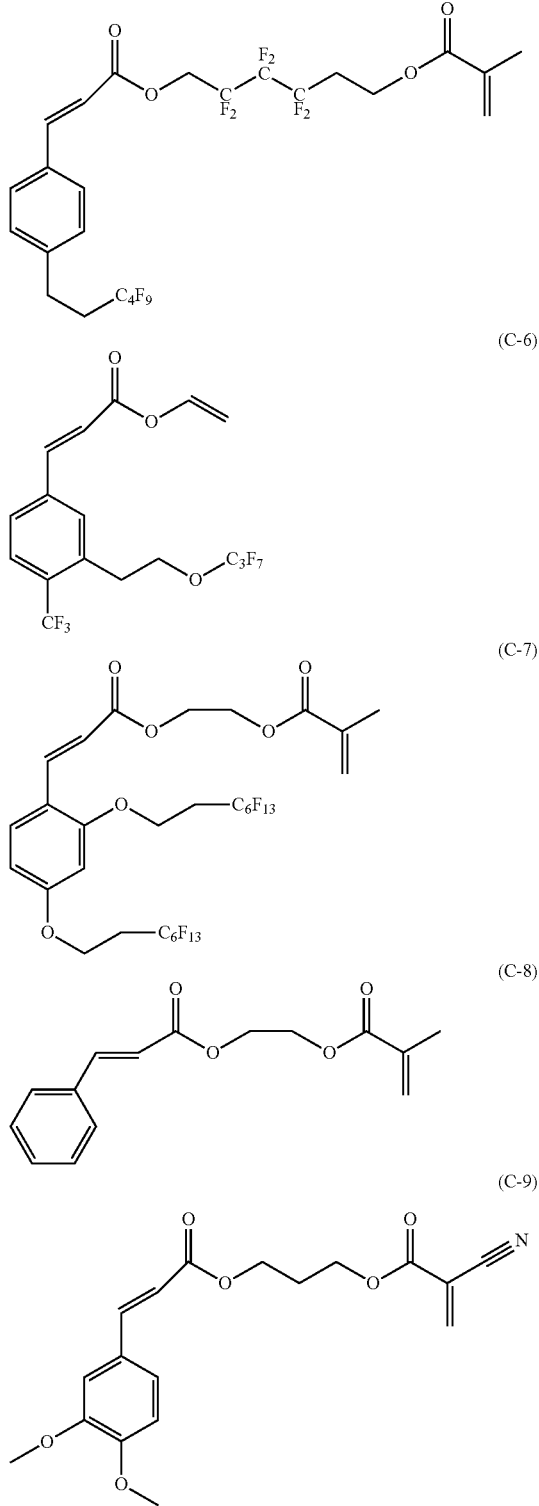

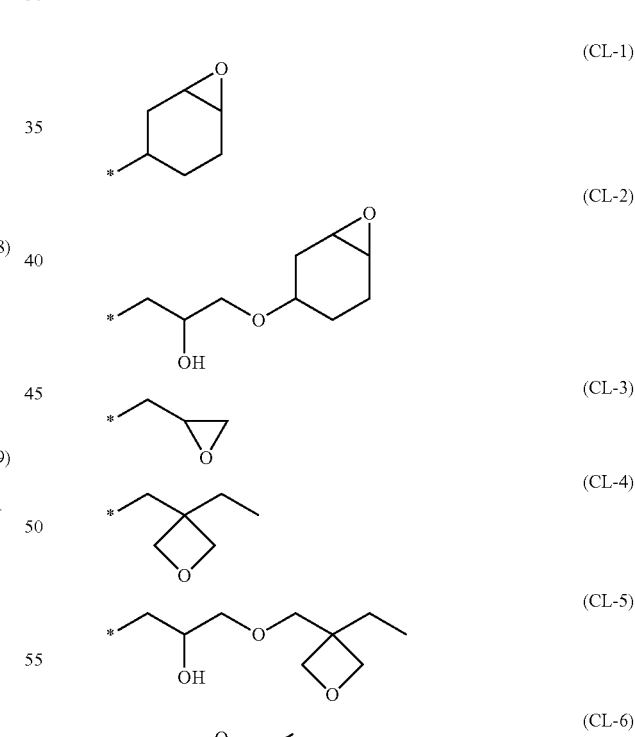

naphthalenes, anthracenes, benzanthrone, phenanthrenes, crysens, anthrones, 5-nitroacenapthene, 4-nitroaniline, 3-nitrofluorene, 4-nitromethylaniline, 4-nitrobiphenyl, picramide, 4-nitro-2,6-dichlorodimethylaniline, Michler's ketone, N-acyl-4-nitro-1-naphthylamine.

Examples of acid-catalyzed cross-linkable groups include, but are not limited to, cyclic ether groups and vinyloxy groups. In an embodiment, the cyclic ether is an epoxide or an oxetane. The photopolymer composition including an acid-catalyzed cross-linkable group typically includes a PAG compound and operates as a "chemically amplified" type of system in a manner described above. Upon exposure to light, the PAG generates an acid (either directly or via a sensitizing dye as described above), which in turn, catalyzes the cross-linking of the acid-catalyzed cross-linkable groups. This significantly changes its solubility relative to the unexposed regions thereby allowing development of an image with the appropriate fluorinated solvent. Usually, cross-linking reduces solubility. In an embodiment, the developing agent includes a fluorinated solvent that selectively dissolves unexposed areas. In an embodiment, a cross-linkable group is provided from a monomer in a weight percentage range of 4 to 40% relative to the copolymer.

Some non-limiting examples of some acid-catalyzed cross-linkable groups include the following wherein (*) refers to an attachment site to the polymer or the polymerizable group of a monomer:

Compositions comprising such materials may optionally further include a sensitizing dye. Some non-limiting examples of useful sensitizing dyes for cinnamate cross-linking groups include diaryl ketones (e.g., benzophenones), arylalkyl ketones (e.g., acetophenones), diaryl butadienes, diaryl diketones (e.g. benzils), xanthones, thioxanthones, A combination of multiple second monomers or second repeating units having different solubility-altering reactive groups may be used. For example, a fluorinated photopolymer may comprise both acid-forming and an alcohol-forming precursor groups. In some embodiments, the photopolymer uses a cross-linkable group in conjunction with an acid- or alcohol-forming precursor group (or both).

The copolymer may optionally further include a branching unit. In an embodiment, the branching unit is provided by a branching monomer having at least two polymerizable sites capable of being copolymerized with the other monomers. Some non-limiting examples of useful polymerizable groups include those described for the first monomer. Some representative examples of branching monomers include: aliphatic or alicyclic divinyl hydrocarbons such as isoprene, butadiene, 3-methyl-1,2-butadiene, 2,3-dimethyl-1,3-butadiene, 1,2-polybutadiene, pentadiene, hexadiene, octadiene, cyclopentadiene, cyclohexadiene, cyclooctadiene, norbornadiene, and the like; aromatic divinyl hydrocarbons such as divinylbenzene, divinyltoluene, divinylxylene, trivinylbenzene, divinylbiphenyl, divinylnaphthalene, divinylfluorene, divinylcarbazole, divinylpyridine, and the like; divinyl and diallyl esters such as divinyl adipate, divinyl maleate, divinyl phthalate, divinyl isophthalate, divinyl itaconate, vinyl (meth)acrylate, diallyl maleate, diallyl phthalate, diallyl isophthalate, diallyl adipate, allyl(meth)acrylate, and the like; divinyl and diallyl ethers such as diallyl ether, diallyloxyethane, triallyloxyethane, tetraallyloxyethane, tetraallyloxypropane, tetraallyloxybutane, tetramethallyloxyethan; divinyl ether, diethylene glycol divinyl ether, triethylene glycol divinyl ether, and the like; divinyl ketones; diallyl ketones; fluorine-containing divinyl compounds such as 1,4-divinylperfluorobutane, 1,6-divinylperfluorohexane, 1,8-divinylperfluorooctane, and the like; nitrogen-containing divinyl compounds such as diallylamine, diallylisocyanurate, diallylcyanurate, methylenebis(meth)acrylamide, bismaleimide, and the like; silicon-containing divinyl compound such as dimethyldivinylsilane, divinylmethylphenylsilane, diphenyldivinylsilane, 1,3-divinyl-1,1,3,3-tetramethyldisilazane, 1,3-divinyl-1,1,3,3-tetraphenyldisilazane, diethoxyvinylsilane, and the like.

In a preferred embodiment, the branching monomer having at least two polymerizable sites are based on (meth) acrylic acid esters such as ethylene glycol di(meth)acrylate (EGD(M)A), triethylene glycol di(meth)acrylate, propylene glycol di(meth)acrylate, neopentyl glycol di(meth)acrylate, trimethylolpropane tri(meth)acrylate, ditrimethylolpropane tetra(meth)acrylate, glycerol tri(meth)acrylate, pentaerythritol tetra(meth)acrylate, alkoxytitanium tri(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, tricyclodecanedimethanol di(meth)acrylate, dioxane glycol di(meth)acrylate, 2-hydroxy-1-acryloyloxy-3-methacryloyloxy propane, 2-hydroxy-1,3-di (meth)acryloyloxypropane, 9,9-bis[4-(2-(meth) acryloyloxyethoxy)phenyl]fluorene, undecylenoxy ethyleneglycol di(meth)acrylate, bis[4-(meth)acryloylthiophenyl]sulfide, bis[2-(meth)acryloylthioethyl]sulfide, 1,3-adamantanediol di(meth)acrylate, 1,3-adamantanedimethanol di(meth)acrylate, and the like.

A combination of multiple branching monomers or branching units having different chemical structures may be used. In an embodiment, the mole % of branching units relative to the total of all copolymer units is in a range of 0.5 to 10%, or alternatively 1 to 10%, or alternatively 1 to 6%, or alternatively 2 to 6%. Methods of polymerization are known in the art. Typical free-radical initiators include azo compounds, peroxides and peroxyesters. Azo compounds are generally preferred. In embodiment, chain transfer agents are used in conjunction with a radical polymerization initiator to control molecular weight. Chain transfer agents may also be used in conjunction with branching monomers to control the degree of branching. Non-limiting examples of useful chain transfer agents include thiols such as alkyl mercaptans (e.g., dodecyl mercaptan), alkyl thioglycolates (e.g., 2-ethyl hexyl thioglycolate), polyfunctional thiols, and brominated compounds such as carbon tetrabromide.

Many useful PAG compounds exist that may be added to a photopolymer composition. In the presence of proper exposure and sensitization, this photo-acid generator will liberate an acid, which will react with the second monomer portion of the fluorinated photopolymer material to transform it into a less soluble form with respect to fluorinated solvents. If added as a small molecule component to the photopolymer composition, the PAG preferably has some solubility in the coating solvent. The amount of PAG required depends upon the particular system, but generally, will be in a range of 0.1 to 6% by weight relative to the copolymer. In an embodiment, the amount of PAG is in a range of 0.1 to 2% relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4, 4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate. Suitable PAGs are not limited to those specifically mentioned above and some ionic PAGs can work, too. Combinations of two or more PAGs may be used as well.

In an embodiment, the PAG is provided as an additional repeating unit of the copolymer. In this embodiment, the acid-forming portion of the photoacid generator compound may remain attached to the copolymer upon activation, or alternatively, the acid-forming portion of the photoacid generator compound detaches from the copolymer upon activation.

The copolymer may comprise an additional repeating unit having an acid-quenching group such as a trialkyl amine. Such groups can slow or prevent photo-generated acid formed in upper portions of the exposed photopolymer structure from reaching the base and potentially interacting with the device substrate. In an embodiment, the acid-quenching group is provided in a range of 0.01 to 0.2% by mole relative to the moles of copolymer repeating units, alternatively in a range of 0.02 to 0.15%.

In an embodiment, the radiation-absorbing dye of the third repeating unit includes no fluorine atoms and is provided in a range of 1 to 15% by mole relative to the total moles of copolymer repeating units, alternatively in a range of 4 to 10%.

In an embodiment, the third monomer includes one or more fluorine atoms (a fluorinated third monomer). The fluorine atoms can be included as part of the polymerizable group or as part of the sensitizing dye. Fluorine can be attached to an alkyl, aryl or heteroaryl moiety. In an embodiment, the third monomer has three or more fluorine atoms attached to an alkyl group. In an embodiment, a fluorinated third monomer is provided in a range of 1 to 20% by mole relative to the total moles of copolymer repeating units, alternatively in a range of 5 to 15%.

Some non-limiting examples of useful radiation-absorbing dye classes include cyanine dyes, rhodamine compounds, dialkylaminobenezes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, pyrelenes, and pyrenes.

In an embodiment, the third monomer includes a polymerizable group and a coumarin-based radiation-absorbing dye. In an embodiment, the third monomer has a structure according to formula (3):

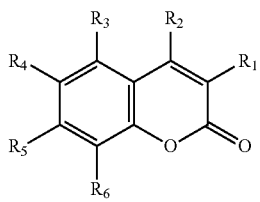

(3)

wherein at least one of substituents $R_1$ through $R_6$ of formula (3) is a polymerizable group and the remaining substituents independently represent a hydrogen atom, a halogen atom, a cyano group, or a substituted or unsubstituted alkyl, alkoxy, alkylthio, aryl, aryloxy, amino, alkanoate, benzoate, alkyl ester, aryl ester, alkanone, alkyl sulfone, aryl sulfone or monovalent heterocyclic group.

In an embodiment, $R_1$ or $R_2$ of formula (3) may represent an electron withdrawing group, e.g., an alkyl ester, an aryl ester, a fluorine-substituted alkyl or a cyano group. Alternatively, or in combination, one or more of substituents $R_3$ through $R_6$ may represent an electron donating group, e.g., an alkoxy, an aryloxy or an amino group. Such modifications may advantageously shift the absorbance to longer wavelengths. In an embodiment, $R_1$ is a polymerizable group, and one or both of $R_3$ and $R_5$ represent an alkoxy group that optionally includes at least one fluorine atom.

In an embodiment, the polymerizable group of the third monomer is an acrylate and has a structure according to formula (4):

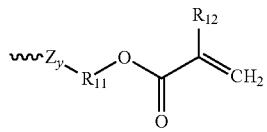

(4)

wherein $R_{11}$ of formula (4) represents a substituted or unsubstituted alkyl or aryl group, and $R_{12}$ represents a hydrogen atom, a cyano group or a substituted or unsubstituted alkyl group having 6 or fewer carbon atoms, Z represents $-\!\!\!\!+\!O\!+\!\!\!\!-$, $-\!\!\!\!+\!C(O)O\!+\!\!\!\!-$, or $-\!\!\!\!+\!N(R_{13})\!+\!\!\!\!-$, y=0 or 1, and $R_{13}$ represents a hydrogen atom or a substituted or unsubstituted alkyl or aryl group.

In an embodiment, the third monomer has a structure according to formula (5):

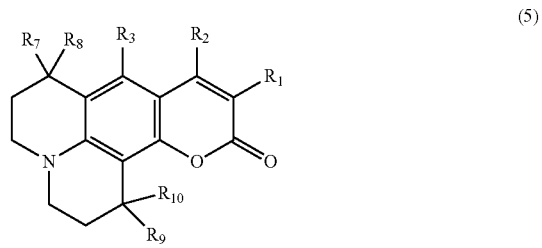

(5)

wherein $R_7$ through $R_{10}$ of formula (5) independently represent a hydrogen atom or a substituted or unsubstituted alkyl group and $R_1$ through $R_3$ are defined in as in formula (3). Many coumarin dyes according to formula (5) have significant photosensitivity at g-line (436 nm).

Some non-limiting examples of the third monomer having an incorporated radiation absorbing dye include:

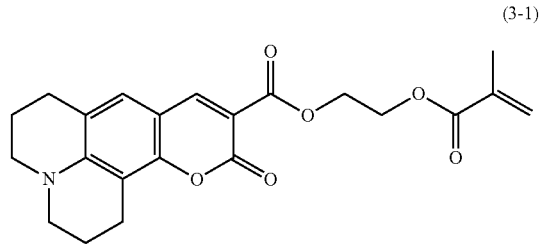

(3-1)

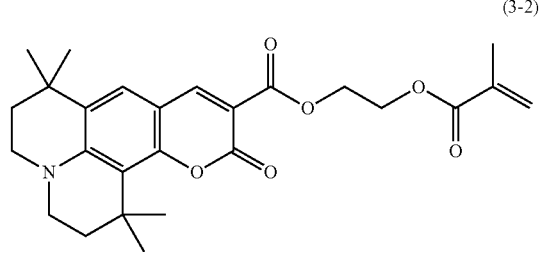

(3-2)

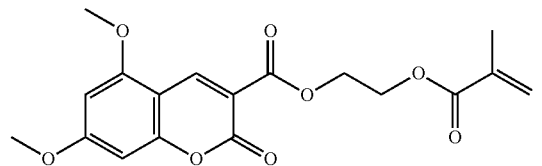

(3-3)

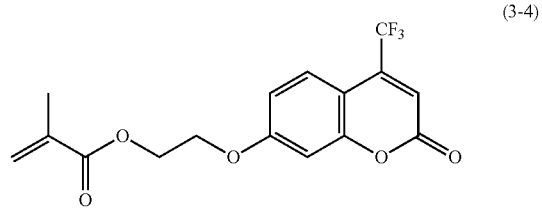

(3-4)

-continued
(3-5)
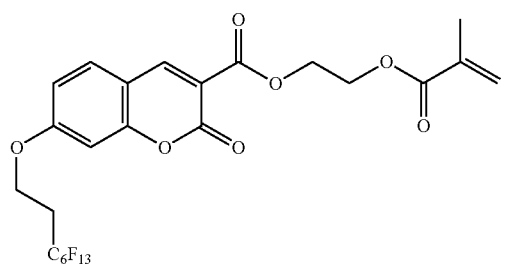
(3-6)
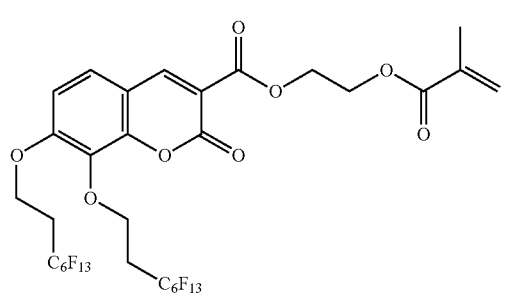
(3-7)
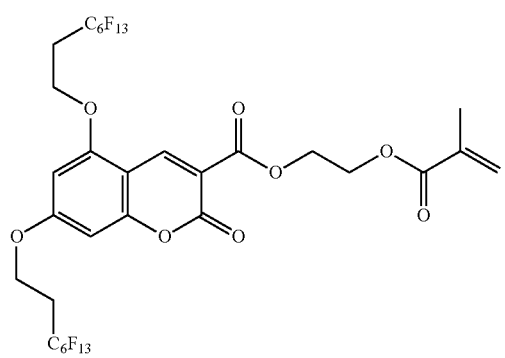
(3-8)
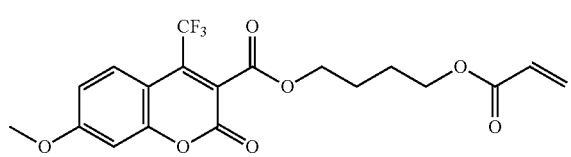
(3-9)
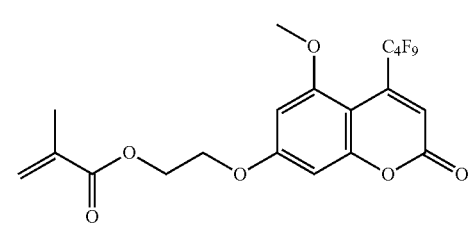
-continued
(3-10)
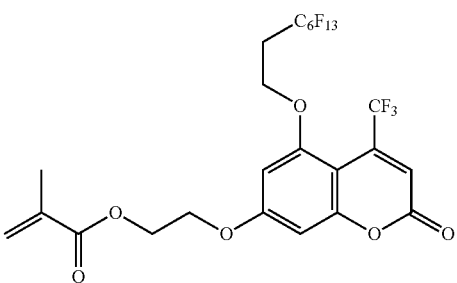
(3-11)
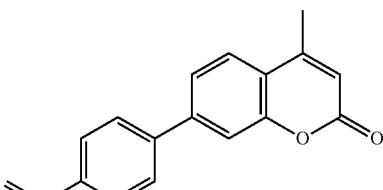
(3-12)
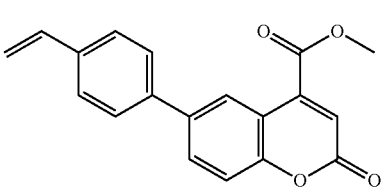
(3-13)
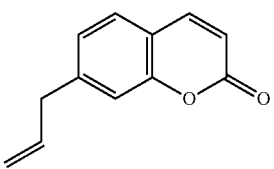
(3-14)
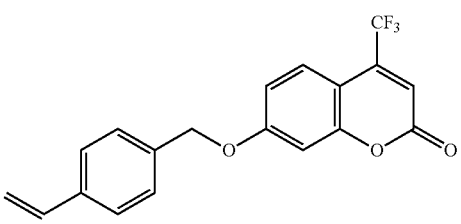
(3-15)
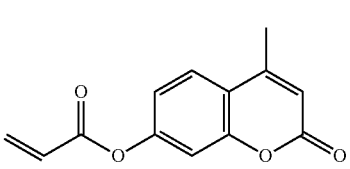
(3-16)
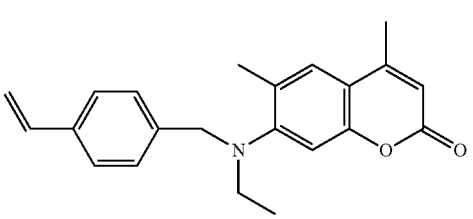

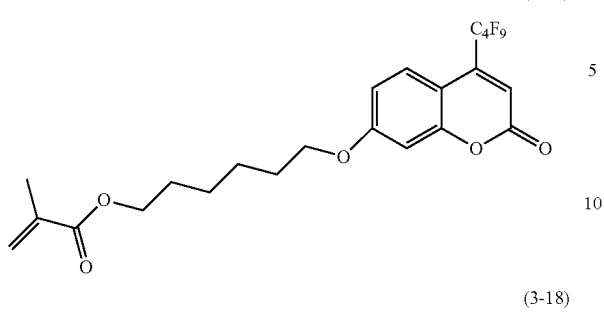
(3-17)
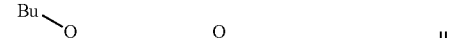
(3-18)
In an embodiment, the third monomer includes an anthracene-based radiation-absorbing dye. Some non-limiting examples of such monomers include:
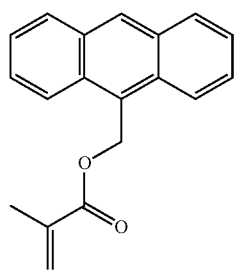
(AN-1)
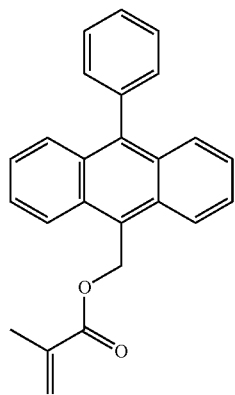
(AN-2)
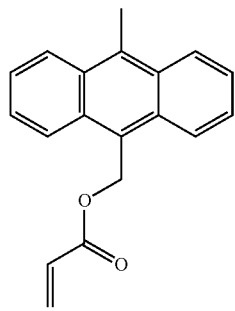
(AN-3)
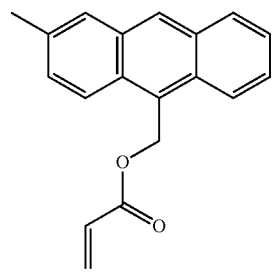
(AN-4)
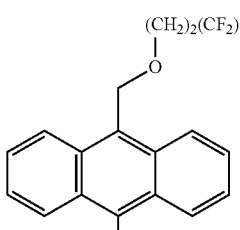
(AN-5)
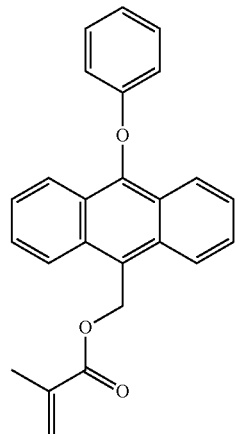
(AN-6)
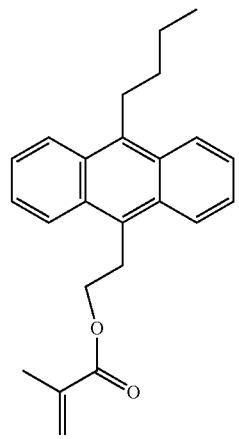
(AN-7)

(AN-8)
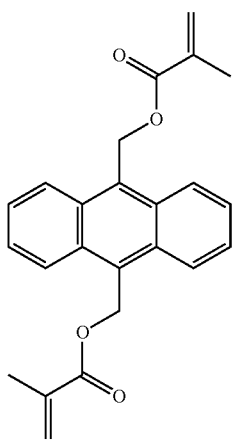
(AN-9)
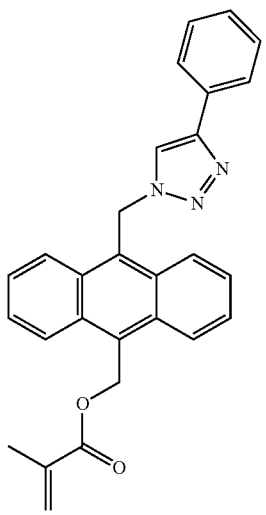
(AN-10)
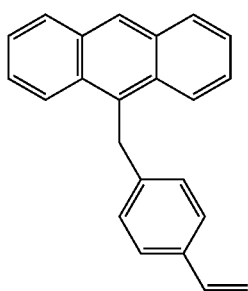
(AN-11)
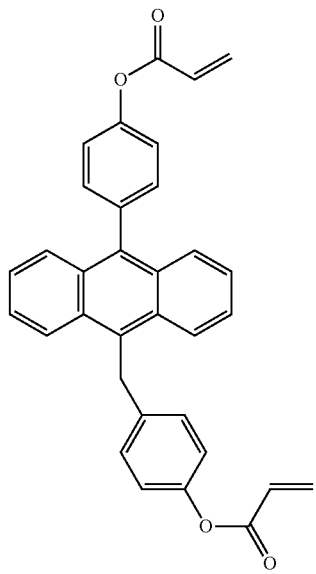
(AN-12)
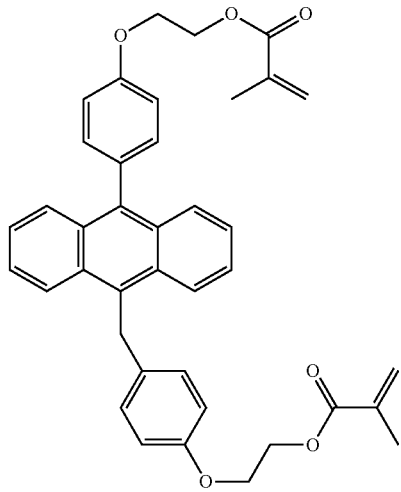
(AN-13)
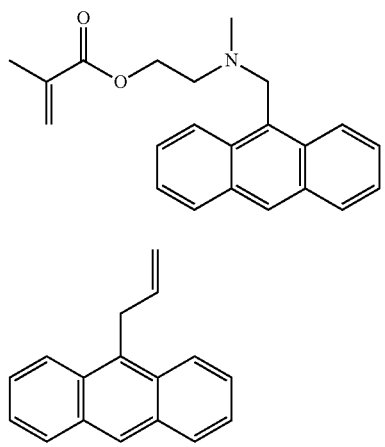
(AN-14)

-continued
(AN-15)
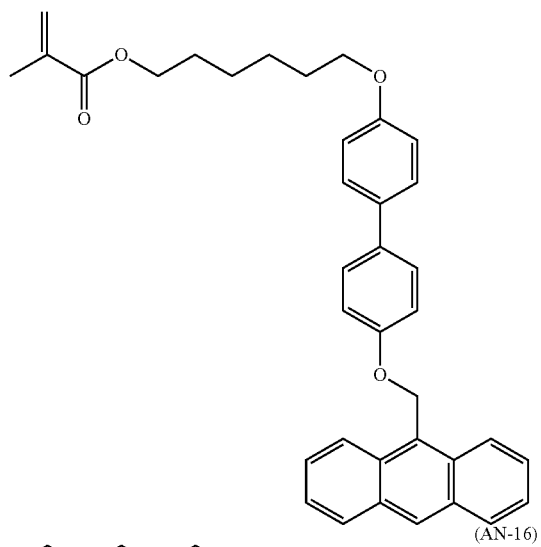
(AN-20)
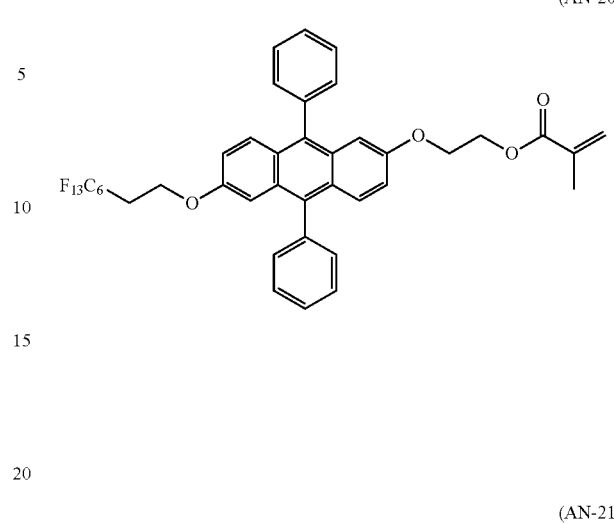
(AN-16)
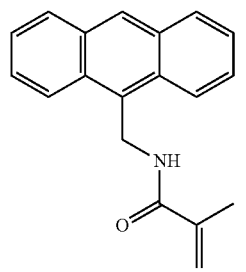
(AN-21)
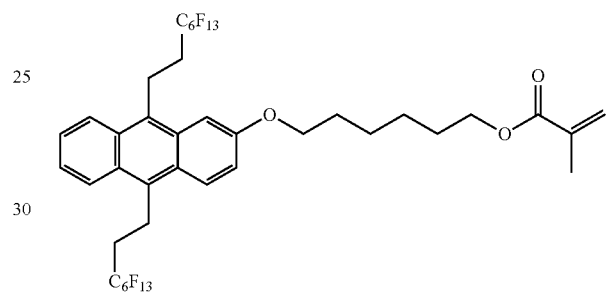
(AN-17)
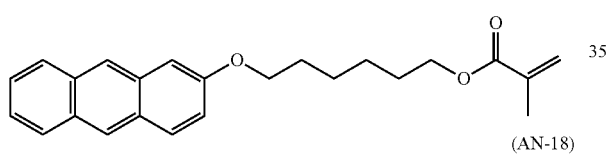
(AN-18)
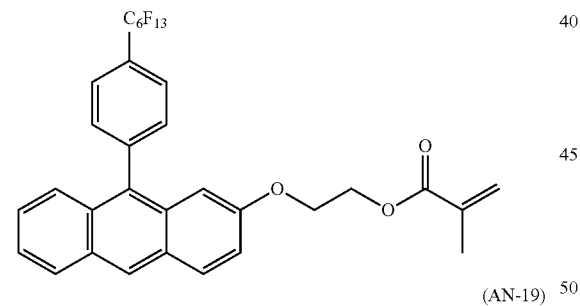
(AN-22)
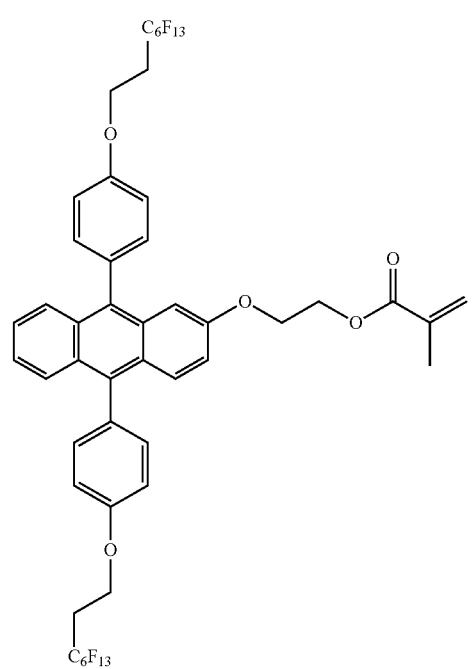
(AN-19)
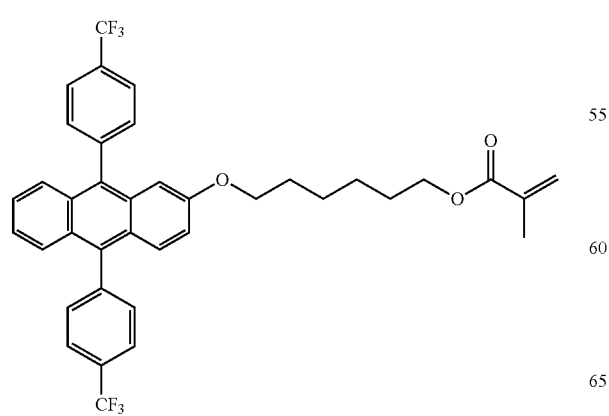

-continued (AN-23)

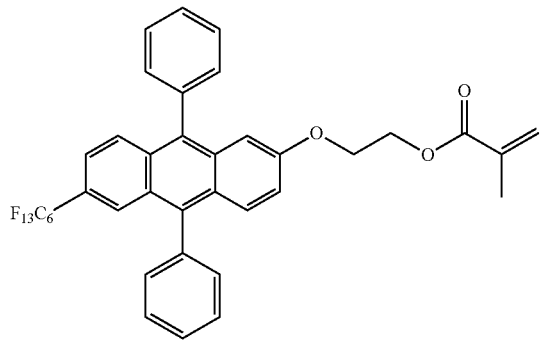

The copolymer may optionally include additional repeating units having other functional groups or purposes. For example, the copolymer may optionally include a repeating unit that adjusts some photopolymer or film property (e.g., solubility, Tg, light absorption, sensitization efficiency, adhesion, surface wetting, etch resistance, dielectric constant, or the like). Similarly, a coatable composition may include agents (not part of the copolymer) to adjust a particular property of a coated film. For example, the composition may include an acid-scavenging (acid-quenching) compound to adjust the photosensitivity of the film. Some non-limiting examples of acid scavengers include certain nitrogen-containing compounds such as tertiary amines, aromatic amines and nitrogen heterocycles. As mentioned above such compounds may instead be optionally attached covalently to the photopolymer thereby incorporating acid-scavenging groups directly.

The photochemical "speed point" and "contrast" of the present fluorinated photopolymer system can be useful factors in selecting the appropriate fluorinated photopolymer, exposure dose and development conditions.

To study these parameters, the following general method can be used. A subject fluorinated photopolymer is spin coated onto a silicon wafer and soft-baked on a hot plate for 1 min at 90° C. An optical tablet (typically 22 steps with ~0.15 density units per step) is laid on top of the wafer and the resist exposed to 365 nm radiation using a Pluvex 1410 UV exposure unit or a Karl Suss mask aligner. The maximum exposure dose is typically about 350 mJ/cm$^2$, but other doses can be used. If the fluorinated photopolymer included a PAG, the wafer is post-exposure baked (PEB) on a hot plate for 1 min at 90° C. to activate the switching reaction. The film thickness is then immediately measured in the various steps using a Filmetrics F20 Thin Film Analyzer. In addition to the areas of the step tablet, the maximum exposure dose can measured just outside of the step tablet area as well as a minimum exposure dose area (covered by an opaque object) that received no exposure.

Figure 2:
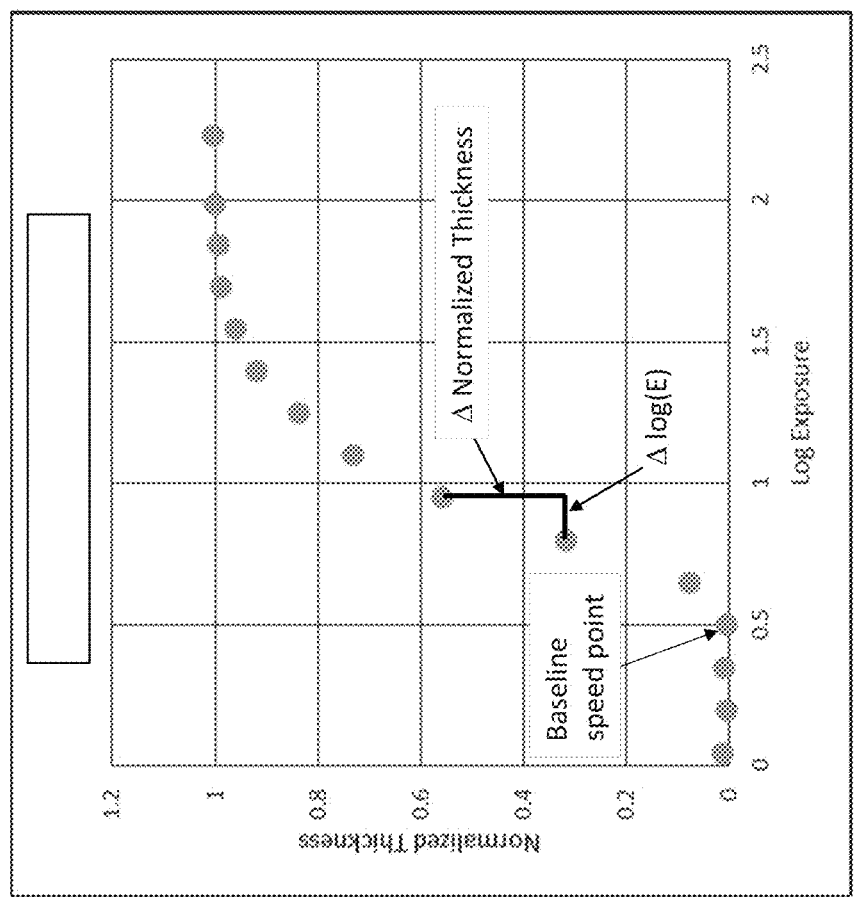
FIG. 2 is a graph depicting a contrast curve obtained for a fluorinated photopolymer.

At least five minutes after the PEB, the wafer is contacted with ~10 mL of a developer solution by forming a "puddle" over the wafer and spin-dried after the target time is reached. The time of each puddle and number of puddles depended on the system. The developer and development time do not necessarily have to be identical to those used for photolithographic testing, but they should be similar. After each puddle, the film thicknesses are measured in the same step areas. Film thicknesses after each puddle are normalized to the starting thickness and plotted versus log Exposure (log (E)) to create a set of contrast curves. FIG. 2 shows an example graph of normalized thickness vs. log(E)—for clarity, only some of the points are shown. The baseline "speed point" (highest exposure dose that fully dissolves in developer under development conditions) can be readily determined from this plot. If so desired, contrast between each point can be calculated using Equation 2:

Contrast=[Δ normalized thickness]/[Δ log(E)]   Equation (2)

For example, the highest calculated contrast (the "maximum contrast") for system can be determined. In an embodiment, the maximum contrast is at least 1.5, alternatively at least 2.5, alternatively greater than 4, or alternatively greater than 5.

In some embodiments it is preferred if the exposed upper portion of the photopolymer stays generally intact during lift-off. For example, less than half of it dissolves in the lift-off agent during this step. This can reduce the formation of debris, e.g., in cases where a material layer is deposited over the developed structure In some embodiments, it is preferred that the density of the exposed upper portion of the photopolymer is less than that of the lift-off solvent. In this way, the exposed portion will separate cleanly from the substrate and float to the lift-off agent surface, carrying any overlying material layers away to reduce damage to the substrate or unwanted deposition of debris.

Mixtures of monomers can be formulated and adjusted to accommodate solubility properties in a variety of fluorinated solvents, especially HFEs. For example, higher fluorine content and higher branching will generally increase solubility in HFEs.

Below are some non-limiting embodiments of the present disclosure.

Method Embodiments

1. A method of patterning a device comprising:
forming over a device substrate a fluorinated photopolymer layer having a lower portion proximate the device substrate and an upper portion distal the device substrate, the fluorinated photopolymer layer comprising a radiation-absorbing dye and a fluorinated photopolymer having a solubility-altering reactive group;
exposing the photopolymer layer to patterned radiation to form exposed and unexposed areas in accordance with the patterned radiation; and
forming a developed structure by removing unexposed areas in a developing agent comprising a first fluorinated solvent,
wherein
the lower portion of the exposed area of the photopolymer layer has a dissolution rate in the developing agent that is at least 5 times higher than a dissolution rate for the upper portion.

2. A method of patterning a device comprising:
forming over a device substrate a fluorinated photopolymer layer comprising a radiation-absorbing dye and a fluorinated photopolymer having a solubility-altering reactive group;
exposing the photopolymer layer to patterned radiation to form an exposed photopolymer layer having exposed and unexposed areas in accordance with the patterned radiation; and
contacting the exposed photopolymer layer with a developing agent to remove the unexposed areas, thereby forming a developed structure having a first pattern of photopolymer covering the device substrate and a complementary second pattern of uncovered substrate corresponding to the removed unexposed areas, the developing agent comprising a first fluorinated solvent,
wherein
the radiation provides a total exposure dose EXP (mJ/cm$^2$) at an exposure wavelength $\lambda_{exp}$,
the photopolymer layer has a thickness $T_f$ (µm), an absorptivity $\alpha$ (absorbance/µm) at $\lambda_{exp}$ and a speed point SP (mJ/cm$^2$) under conditions used for the exposing and contacting with the developing agent, and
a processing factor, P, is in a range of 0.1 to 0.95 wherein P=[log(EXP/SP)]/($\alpha$*$T_f$).

3. The method according to embodiment 1 or 2 wherein the radiation-absorbing dye is covalently attached the fluorinated photopolymer.

4. The method according to embodiment 3 wherein the fluorinated photopolymer is a copolymer comprising a first repeating unit having a fluorine-containing group, a second repeating unit having a solubility-altering reactive group, and a third repeating unit having a radiation-absorbing dye.

5. The method according to any of embodiments 1-4 wherein the fluorinated photopolymer has a fluorine content of at least 10% by weight.

6. The method according to any of embodiments 1-5 wherein the fluorinated photopolymer has a fluorine content in a range of 30 to 60% by weight.

7. The method according to any of embodiments 1-6 wherein the developed structure has an undercut profile.

8. The method according to any of embodiments 1-7 wherein the first fluorinated solvent is a first hydrofluoroether.

9. The method according to any of embodiments 1-8 further comprising treating the developed structure with a lift-off agent comprising a second fluorinated solvent.

10. The method according to embodiment 9 wherein the second fluorinated solvent is a hydrofluoroether.

11. The method according to embodiment 10 wherein the second fluorinated solvent is different from the first fluorinated solvent.

12. The method according to any of embodiments 9-11 wherein the lift-off agent dissolves less than half of the upper portion of the exposed area layer thickness during the treating.

13. The method according to any of embodiments 1-12 wherein the fluorinated photopolymer layer further comprises a photoacid generator compound, optionally attached to the fluorinated photopolymer.

14. The method according to any of embodiments 1-13 wherein the fluorinated photopolymer layer further comprises an acid-scavenging compound.

15. The method according to embodiment 14 wherein the acid-scavenging compound is covalently attached to the fluorinated photopolymer.

16. The method according to embodiment 14 or 15 wherein the acid-scavenging compound includes a tertiary amine group.

17. The method according to any of embodiments 1-16 wherein the solubility-altering reactive group is an acid- or alcohol-forming precursor group.

18. The method according to any of embodiments 1-17 wherein the fluorinated photopolymer comprises more than one type of solubility-altering reactive group.

19. The method according to any of embodiments 1-18 wherein the fluorinated photopolymer further includes a branching unit.

20. The method according to any of embodiments 1-19 wherein the fluorinated photopolymer layer is provided from a first composition comprising a fluorinated coating solvent.

21. The method according to any of embodiments 1-20 further comprising providing an intervening fluoropolymer layer between the photopolymer layer and the device substrate, the intervening fluoropolymer layer comprising a fluoropolymer.

22. The method according to embodiment 21 wherein the intervening fluoropolymer layer is provided from a second composition comprising a second fluorinated coating solvent.

23. The method according to embodiment 21 or 22 wherein the intervening fluoropolymer layer includes an acid-scavenging compound, optionally attached to the fluoropolymer.

24. The method according to any of embodiments 21-23 wherein the fluorine content of the intervening fluorinated polymer layer is in a range of 40 to 75% by weight.

25. The method according to any of embodiments 21-24 wherein the intervening fluoropolymer layer is substantially unaltered chemically when exposed to the patterned radiation.

26. The method according to any of embodiments 21-25 wherein the intervening fluoropolymer layer is soluble in the developing agent used to develop the exposed photopolymer layer.

27. The method according to any of embodiments 1-26 wherein the radiation-absorbing dye is a sensitizing dye.

28. The method according to any of embodiments 1-27 wherein the radiation-absorbing dye is fluorinated.

29. The method according to any of embodiments 1-28 wherein the device is an OLED, an OTFT, a bioelectronic device or a MEMS device.

30. The method according to any of embodiments 2-29 wherein P is in a range of 0.6 to 0.92.

31. The method according to any of embodiments 2-30 wherein the photopolymer layer has a maximum contrast greater than 5.

32. The method according to any of embodiments 2-31 wherein $\alpha$ is at least 0.3 absorbance units/µm) at $\lambda_{exp}$.

33. The method according to any of embodiments 2-32 wherein $\alpha$ is at least 0.5 absorbance units/µm) at $\lambda_{exp}$.

34. The method according to any of embodiments 2-33 wherein $T_f$ is at least 1.5 µm.

35. The method according to any of embodiments 1-34 wherein the device is a passive matrix OLED, an active matrix OLED, an area color OLED or a solid-state lighting OLED.

Composition Embodiments

1. A fluorinated photopolymer composition, comprising:
a fluorinated solvent;
a radiation-absorbing dye; and
a fluorinated photopolymer having a fluorine content of at least 10% by weight comprising one or more solubility-altering reactive groups, wherein
a film formed from the composition has, after removal of the fluorinated solvent, an absorptivity of at least 0.3 absorbance units per µm of film thickness when measured at 365 nm, 405 nm or 436 nm.

2. The composition according to embodiment 1 wherein the fluorinated photopolymer has a fluorine content in a range of 30 to 60% by weight.

3. The composition according to embodiments 1 or 2 wherein the radiation-absorbing dye is covalently attached the fluorinated photopolymer.

4. The composition according to embodiment 1-3 wherein the fluorinated photopolymer further comprises a branching unit.

5. The composition according to any of embodiments 1-4 further comprising a photoacid generator compound.

6. The composition of embodiment 5 wherein the photoacid generator compound is covalently attached to the fluorinated photopolymer.

7. The composition according to any of embodiments 1-6 further comprising an acid-scavenging compound.

8. The composition according to embodiment 7 wherein the acid scavenging compound is attached to the fluorinated photopolymer.

9. The composition according to embodiments 7 or 8 wherein the acid scavenging compound includes a tertiary amine group.

10. The composition according to any of embodiments 1-9 wherein the fluorinated photopolymer is a copolymer comprising a first repeating unit having a fluorine-containing group, a second repeating unit having a solubility-altering reactive group, and a third repeating unit having a radiation-absorbing dye.

11. The composition according to embodiment 10 wherein the copolymer further includes a repeating unit having an acid-scavenging group.

12. The composition of embodiment 10 or 11 wherein the copolymer further comprising a repeating unit having a photoacid generator compound.

13. The composition of embodiment 12 wherein the acid-forming portion of the photoacid generator compound remains attached to the copolymer upon activation.

14. The composition of embodiment 12 wherein the acid-forming portion of the photoacid generator compound detaches from the copolymer upon activation.

15. The composition according to any of embodiments 10-14 further wherein the copolymer further comprises a branching unit.

16. The according to embodiment 16 wherein the branching unit is provided in a range of 0.5 to 5 mole % relative to the total moles of repeating and branching units in the copolymer.

17. The composition according to any of embodiments 10-16 wherein the solubility-altering reactive group is an acid- or alcohol-forming precursor group.

18. The composition according to any of embodiments 10-17 wherein the copolymer comprises more than one type of solubility-altering reactive group.

EXAMPLES

Fluorinated Photopolymer Composition 1

A copolymer was prepared by copolymerizing FOMA (a first monomer having a fluorine-containing group), ECPMA (a second monomer having a solubility-altering reactive group), DBCMA shown below (a third monomer having a radiation-absorbing dye), and a branching monomer ethylene glycol dimethacrylate ("EGDMA"). Polymerization was carried out in the presence of 1-dodecanethiol ("DDT") as a chain transfer agent and using 2,2'-azodi(2-methylbutyronitrile) ("AMBN") as the radical chain initiator. The relative mole ratios of FOMA/ECPMA/DBCMA/EGDMA were 48/40/8/4 mol %, respectively, and the copolymer had a fluorine content of about 36.6% by weight. The following procedure was be used.

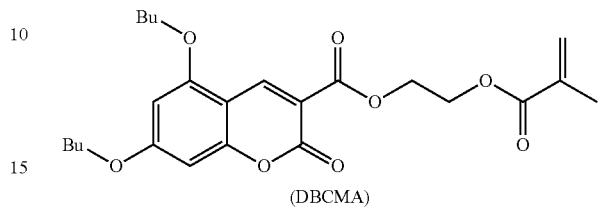
(DBCMA)

A 100 mL flask was charged with 21.9 g HFE-6512 solvent, 6.0 g FOMA, 2.11 g ECPMA, 0.23 g EGDMA, 1.03 g DBCMA, 0.11 g AMBN, and 0.18 g DDT. The mixture was deaerated by sparging with nitrogen for 15 min, then sealed and placed in an oil bath at 70° C. The oil bath temperature was then was raised to 80° C. with stirring and held for 18 hours followed by cooling to room temperature. The homogeneous solution was rinsed out of the reactor with 21 g additional HFE-6512 to form a stock solution having ~18% by weight solids. A light-sensitive solution was prepared by adding 1.0 wt % PAG (CGI 1907) relative to the total copolymer weight. The composition further included trioctylamine (TOA) as an acid quencher at 0.1 wt % relative to the total copolymer weight.

Fluorinated Photopolymer Composition 2

Composition 2 was prepared in a manner analogous to Composition 1, but the relative mol ratios of FOMA/ECPMA/DBCMA/EGDMA were 52/36/8/4 mol %, respectively, and the copolymer had a fluorine content of about 38.4% by weight. Further, the relative level of DDT in the reactor was raised slightly so that mole ratio of DDT to EGDMA was 1/1 (rather than 0.75/1 in Composition 1). A light-sensitive solution was prepared by adding 1.0 wt % PAG (CGI 1907) relative to the total copolymer weight.

Fluorinated Photopolymer Composition 3

Composition 3 was the same as Composition 2 except that it further included 0.1 wt % trioctylamine (TOA) relative to the total copolymer weight.

Photo-Imaging and Lift Off of Compositions 1-3

All the above compositions provided films having a light absorptivity of 0.6 absorbance units per micron of coated film thickness at 365 nm. It was found that a good developing agent for Composition 1 was a mixture of HFE-7300/HFE-6512, e.g., at a ratio of 92/8 or 90/10. For Compositions 2 and 3, a solvent mixture ratio of 97/3 of HFE-7300/HFE-6512 was found to provide a good developing agent. Contrast and speed points under 365 nm radiation were determined for these compositions in the manner described above using a step tablet. Exposed films were given a 1 min 90° C. post exposure bake. All films were found to have a contrast of >6. Images of 50 µm lines and spaces were formed on Si wafers at various 365 nm exposure doses and developed using respective developing agents to test imaging performance and lift-off. Lift-off for all samples was tested in HFE-7100 as the lift-off agent. A summary of results is found in Table 1.

TABLE 1

Lift-off results for 50 μm lines.

| Example | Example type | Composition | Speed point (mj/cm$^2$) | Exposure (mj/cm$^2$) | coated film thickness (μm) | Processing factor, P | Lift-off 50 μm lines? | Lift-off time (min) |
|---|---|---|---|---|---|---|---|---|
| 1 | inventive | 1 | 6.2 | 50 | 2.5 | 0.60 | yes | 1.5 |
| 2 | inventive | 1 | 6.2 | 100 | 2.5 | 0.81 | yes | 2.0 |
| 3 | inventive | 1 | 6.2 | 150 | 2.5 | 0.92 | yes | 4.0 |
| 4 | comparative | 2 | 2.9 | 50 | 2.02 | 1.02 | no | n/a |
| 5 | comparative | 2 | 2.9 | 100 | 2.02 | 1.27 | no | n/a |
| 6 | inventive | 3 | 10 | 50 | 2.22 | 0.52 | yes | <0.5 |
| 7 | inventive | 3 | 10 | 50 | 1.6 | 0.73 | yes | <1.0 |
| 8 | inventive | 3 | 10 | 50 | 1.8 | 0.65 | yes | <1.0 |
| 9 | inventive | 3 | 10 | 50 | 2.0 | 0.58 | yes | <1.0 |
| 10 | inventive | 3 | 10 | 100 | 2.22 | 0.75 | yes | <0.5 |
| 11 | comparative | 3 | 10 | 100 | 1.6 | 1.04 | no | n/a |
| 12 | comparative | 3 | 10 | 100 | 1.8 | 0.93 | no | n/a |
| 13 | inventive | 3 | 10 | 100 | 2.0 | 0.83 | yes | <2.0 |
| 14 | comparative | 3 | 10 | 100 | 1.7 | 0.98 | no | n/a |

Figure 3:
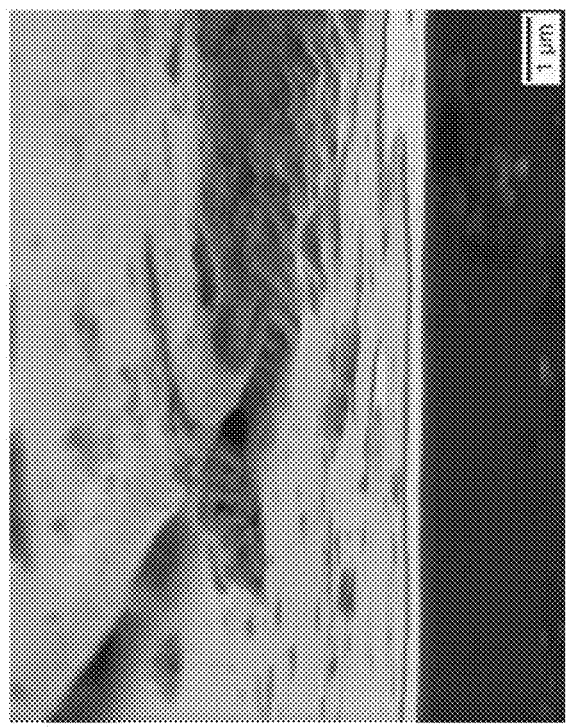
FIG. 3 is an SEM photograph showing a cross-section of an undercut developed structure of the present disclosure.
Figure 5:
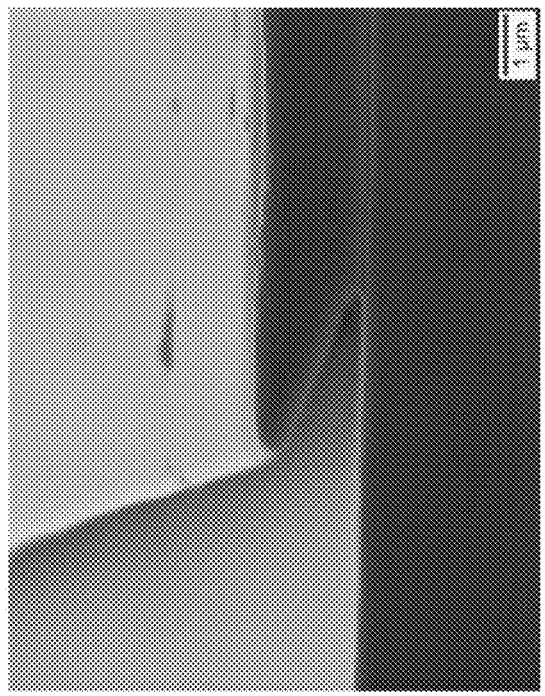
FIG. 5 is an SEM photograph showing a cross-section of an undercut developed structure of the present disclosure.
Figure 4:
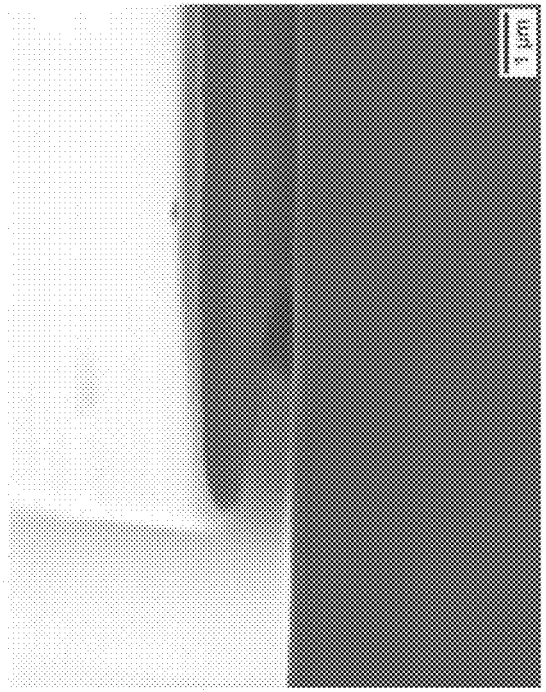
FIG. 4 is an SEM photograph showing a cross-section of an undercut developed structure of the present disclosure.
Figure 7:
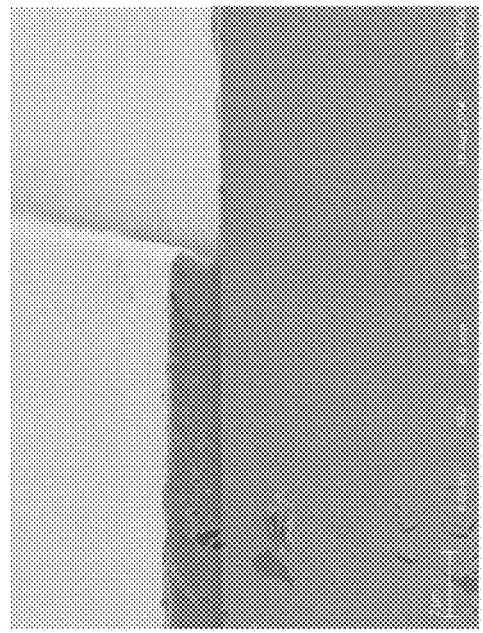
FIG. 7 is an SEM photograph showing a cross-section of an undercut developed structure of the present disclosure.
Figure 6:
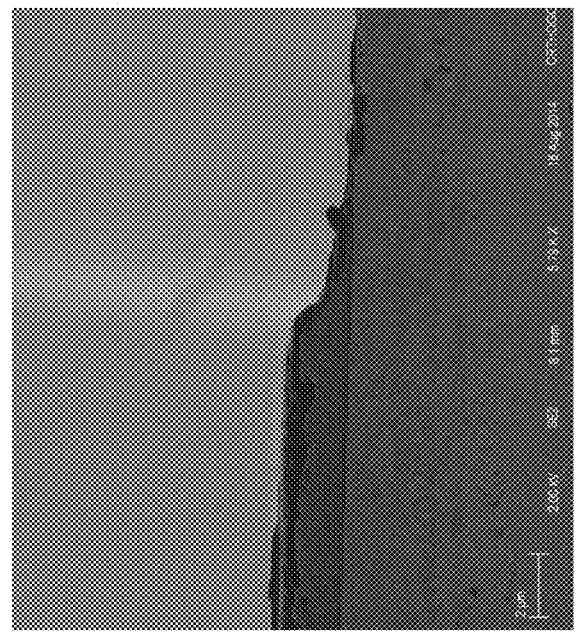
FIG. 6 is an SEM photograph showing a cross-section of a comparative developed structure.

Table 1 demonstrates that rapid lift-off is achieved in just a few minutes or less when the processing factor, P, is 0.92 or less. Above this threshold, however, lift-off was not achieved even after an hour or more. By comparison, it should be noted that many lift-off processes in the prior art take hours to achieve. FIGS. 3-5 show cross-sectional SEM images of Examples 1-3, respectively, prior to lift-off. All of the samples show the generally desired undercut profile. Example 1 appears to have some residue, which may be due to its relatively low processing factor, P, of 0.60 resulting in higher amounts of dissolving photopolymer. Although such residue may be cleaned up with additional or altered processing, Examples 2 and 3 show very little residue. FIGS. 6 and 7 show cross sectional images of Examples 5 and 10, respectively. Example 10 (P=0.75) has the desired undercut profile whereas Example 5 (P=1.27) is not undercut and has undesired sloping sidewalls. Further, Example 5 did not lift-off.

Fluorinated Photopolymer Composition 4

Composition 4 was prepared in a manner analogous to Composition 1, but further included an acid-scavenging monomer, diethylamino ethylmethacrylate (DEAMA). The relative monomer mole ratios of FOMA/ECPMA/DBCMA/EGDMA/DEAEMA were 54/36/8/2/0.04 mol %, respectively, and the copolymer had a fluorine content of 39.3% by weight. The mole ratio of DDT to EGDMA was 1/1. A light-sensitive solution was prepared by adding about 0.4 wt % PAG (CGI 1907) relative to the total copolymer weight.

Photo-Imaging and Lift Off of Composition 4

Figure 9B:
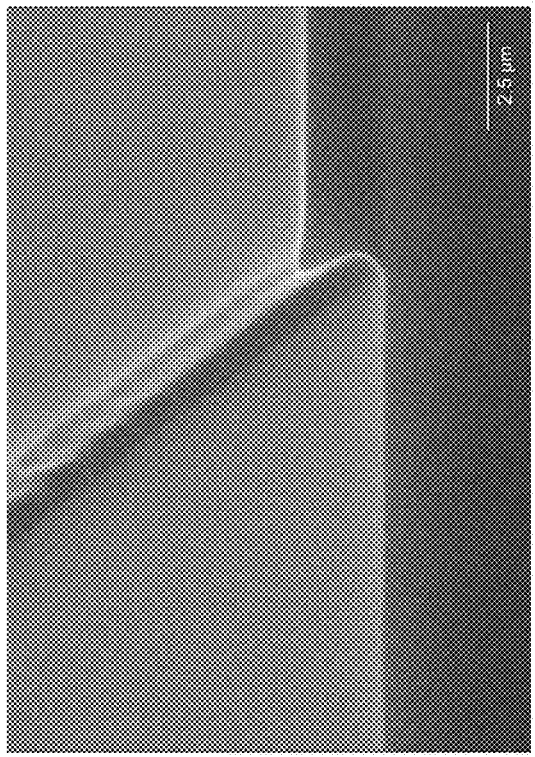
FIGS. 9A and 9B are SEM photographs showing cross-sections of undercut developed structures according to the present disclosure.
Figure 9A:
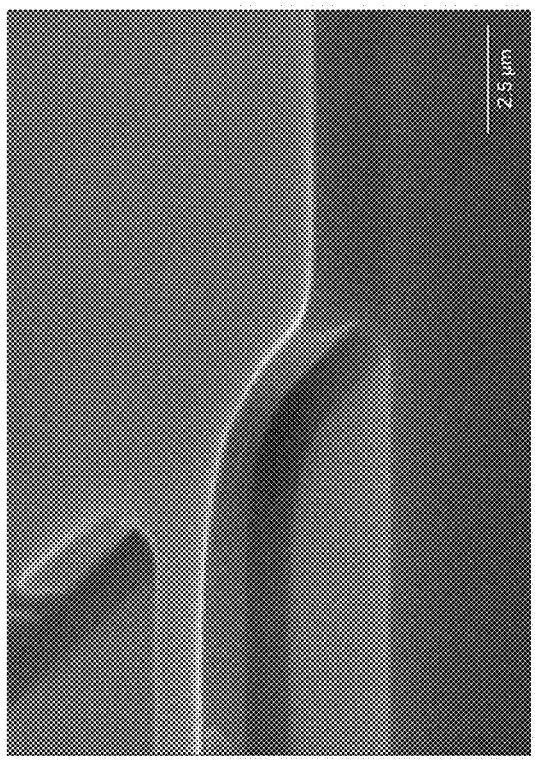

Composition 4 has a light absorptivity of 0.6 absorbance units per micron of coated film thickness at 365 nm. HFE-7300 was found to be a good developing agent. The composition was spin coated and given a 1 min 90° C. post apply bake to form a 2.2 μm film. The film was exposed through a step tablet, given a 1 min 90° C. post exposure bake, and developed in HFE-7300. The speed point was found to be 16.6 mJ/cm$^2$. Two additional films were prepared and imaged using a mask to form an array of 10 μm×36 μm rectangular openings in the resist. One sample (Example 15) was given an exposure dose of 40 mJ/cm$^2$ (P=0.29) and the other (Example 16) was given 70 mJ/cm$^2$ (P=0.47), both at 365 nm. Cross sectional SEMs are shown in FIGS. 9A (40 mJ/cm$^2$ dose) and 9B (70 mJ/cm$^2$ dose). These structures have the desired undercut profile and can be readily lifted-off in HFE-7100 or warm HFE-7300 in a few minutes or less.

Figure 10:
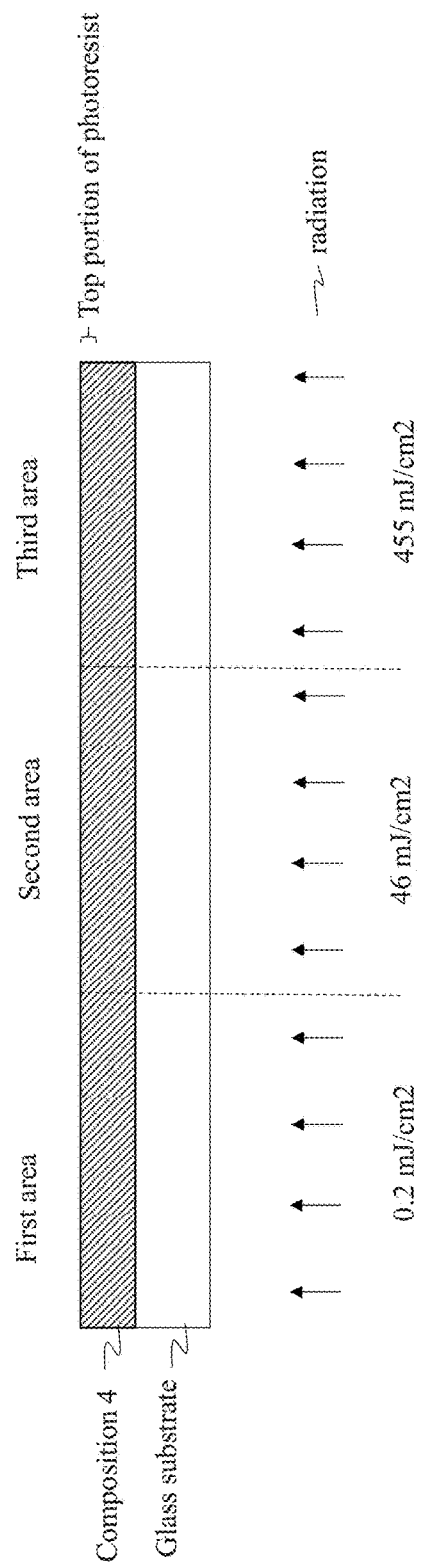
FIG. 10 is a cross-sectional view depicting the exposure a fluorinated photopolymer through a glass substrate.
Figure 11:
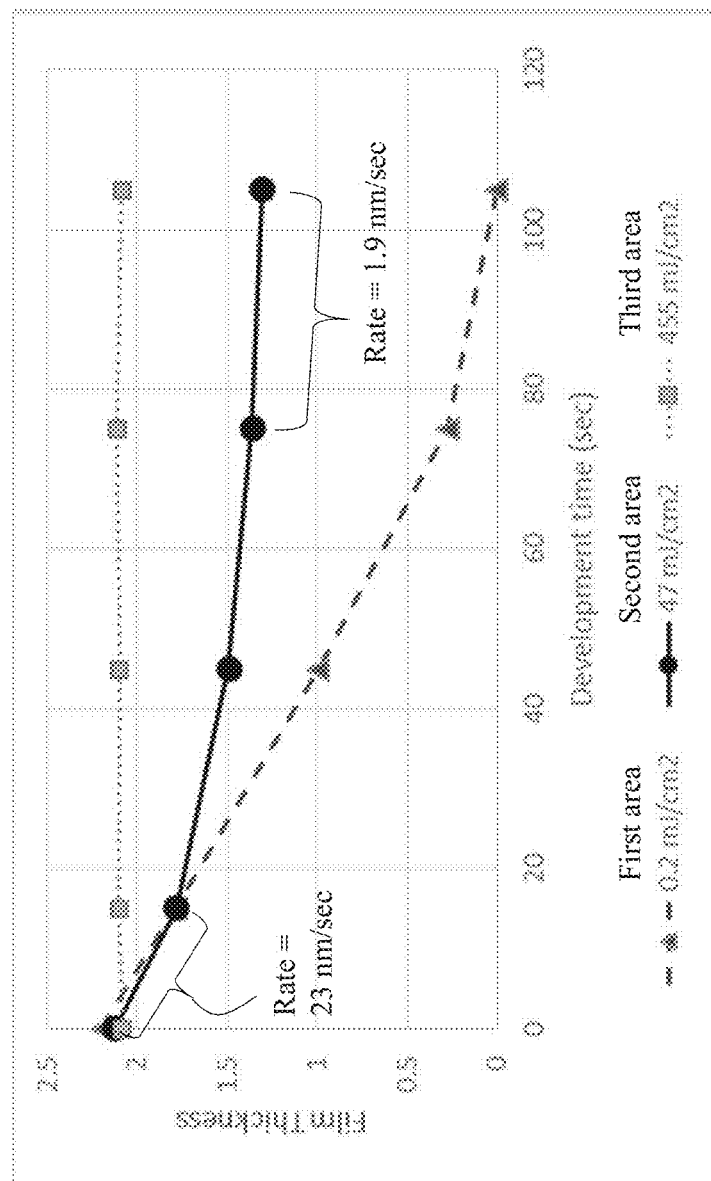
FIG. 11 is a graph showing dissolution rates of a fluorinated photopolymer exposed to various energy doses through a glass substrate.

In another sample (Example 17), Composition 4 was spin coated over a glass substrate and exposed through the glass (FIG. 10). In this way, the top portion of the photoresist exposed through the glass simulates the lower portion of the photoresist in a conventional direct exposure as in FIG. 1. The film was exposed to ~0.2 mJ/cm$^2$ radiation in a first area, 46 mJ/cm$^2$ radiation in a second area and 455 mJ/cm$^2$ radiation in a third area. The development kinetics in HFE-7300 are shown in FIG. 11 for these three regions. As can be seen, the first area having the lowest exposure (process factor, P=−1.45) develops completely away at a uniform rate of about 25 nm/sec. This exposure is too low to form any developed structure. There is no difference in rate between the top and bottom parts of the film. The third area having the highest exposure (P=1.09) does not develop at all in this time period and cannot be used to form a useful lift-off structure. There is no measurable difference in rate between the top and bottom parts of the film. The second area, however, has P=0.34 and there is a clear difference in rates between the top and the bottom portions. At the top of the film (which, in a conventional exposure, would correspond to the lower portion), the rate is 23 nm/sec (first 15 sec). By 105 seconds the rate has slowed to less than 2 nm/sec and the thickness is slowly approaching about 1.3 μm. This lower rate would correspond to the upper portion of a conventional exposure. Thus, in a conventional exposure at this energy (46 mJ/cm$^2$), a lower portion of the exposed fluorinated photoresist would have a dissolution rate more than 10 times that of an upper portion. The processing factor for this second area of Example 17 is intermediate that of the Examples 15 and 16 above, both of which provided the desired undercut and fast lift-off properties.

Fluorinated Photopolymer Composition 5

Composition 5 was prepared in a manner analogous to Composition 1. The polymer included FOMA/TBMA/DBCMA/EGDMA in a mole ratio of 58/32/8/2 respectively, and the copolymer had a fluorine content of about 42.6% by weight. The mole ratio of DDT to EGDMA was 1/1. A light-sensitive solution was prepared by adding about 1.5 wt % PAG (CGI 1907) relative to the total copolymer weight. TBMA is not as reactive as ECPMA and often yields a lower contrast film.

Photo-Imaging and Lift Off of Composition 5

Figure 12:
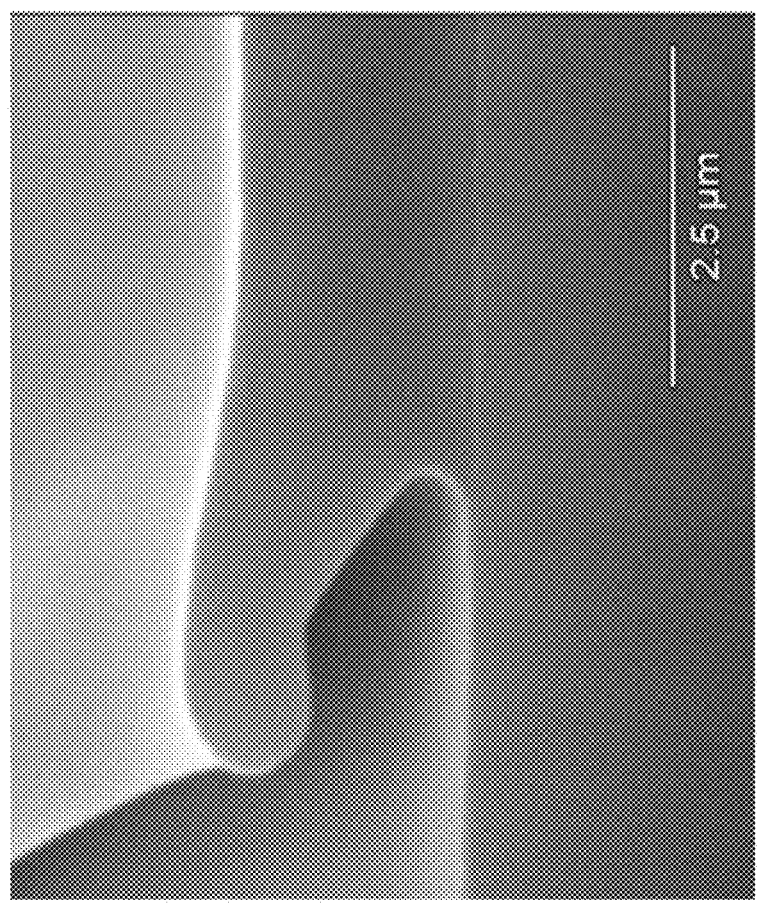
FIG. 12 is an SEM photograph showing a cross-section of an undercut developed structure of the present disclosure.

Composition 5 has a light absorptivity of 0.6 absorbance units per micron of coated film thickness at 365 nm. HFE-7300 was found that a good developing agent. The composition was spin coated and given a 1 min 90° C. post apply bake to form about a 2.0 μm film. The film was exposed through a step tablet, given a 1 min 90° C. post exposure bake, and developed in HFE-7300. Using a step tablet, the speed point was found to be about 5 mJ/cm². Another sample was prepared on a silicon substrate (Example 18) and given an exposure dose of 25 mJ/cm² (P=0.58) through a mask to form an array of 10 μm×36 μm rectangular openings in the photopolymer. A cross sectional SEM is shown in FIG. 12 after two 30 sec puddles of HFE-7300. The imaged resist has the desired undercut profile. A similarly-prepared sample (P=0.65) readily lifted-off in HFE-7100 in about 3.5 minutes. Not shown in FIG. 12, this photopolymer left some film residue in the unexposed areas. The source of this is not known, but it is suspected that stray light may have caused this. Nevertheless, this example shows that a less reactive (lower contrast) solubility-altering monomer can be used.

Fluorinated Photopolymer Composition 6

Composition 6 was prepared in a manner analogous to Composition 1. The polymer included TMSOEMA/FOMA/ECPMA/DBCMA/EGDMA in a mole ratio of 19/49/22/8/2 respectively, and the copolymer had a fluorine content of about 36.6% by weight. The mole ratio of DDT to EGDMA was 1/1. A light-sensitive solution was prepared by adding about 0.2 wt % PAG (CGI 1907) relative to the total copolymer weight along with about 0.02 wt % TOA as an acid quencher. TMSOEMA is an alcohol-forming precursor monomer.

Photo-Imaging and Lift Off of Composition 6

Figure 13:
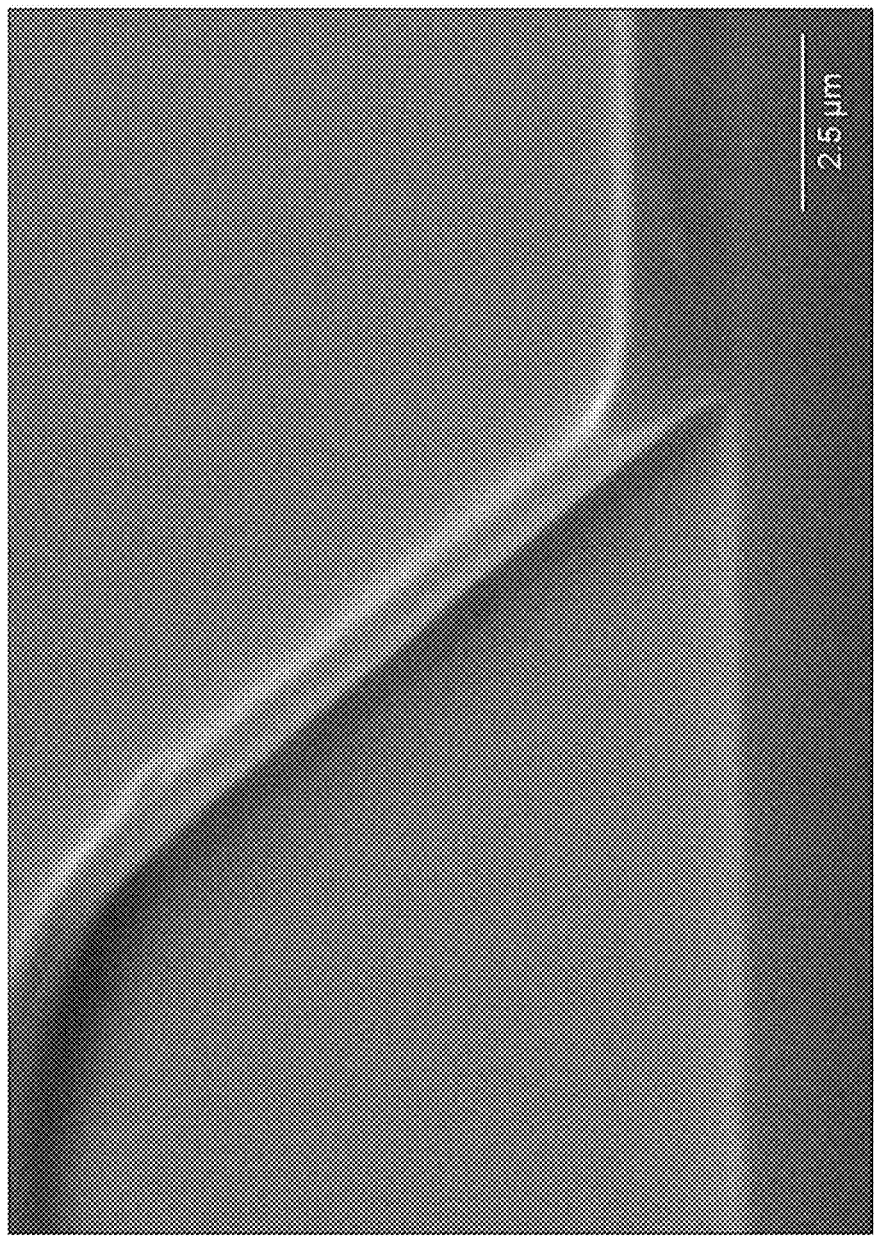
FIG. 13 is an SEM photograph showing a cross-section of an undercut developed structure of the present disclosure.

Composition 6 has a light absorptivity of 0.6 absorbance units per micron of coated film thickness at 365 nm. HFE-7300 was found that a good developing agent. The composition was spin coated on a silicon substrate and given a 1 min 90° C. post apply bake to form about a 2 μm film. The sample was given an exposure dose of 22 mJ/cm² through a mask to form an array of 10 μm×36 μm rectangular openings in the photopolymer (Example 19). A cross sectional SEM is shown in FIG. 13 after one 30 sec puddle of HFE-7300. The imaged resist has the desired undercut profile and readily lifted-off in HFE-7100 in less than 5 minutes. Nevertheless, this example shows that a mixture of acid- and alcohol-forming solubility-altering reactive groups can be used.

Fluorinated Photopolymer Composition 7

Composition 7 was prepared in a manner analogous to Composition 1, but used AN-1 as the monomer having the radiation absorbing dye. The polymer included FOMA/TBMA/AN-1 in a mole ratio of 49/49/2 respectively, and the copolymer had a fluorine content of about 42.1% by weight. A light-sensitive solution was prepared by adding about 0.8 wt % PAG (CGI 1907) relative to the total copolymer weight.

Photo-Imaging and Lift Off of Composition 7

Composition 7 has a light absorptivity of 0.1 absorbance units per micron of coated film thickness at 365 nm. A mixture of HFE-7300 and HFE-7600 (97/3) was found that a good developing agent. The composition was spin coated and given a 1 min 90° C. post apply bake to form about a 1.5 μm film. The film was exposed through a step tablet, given a 1 min 90° C. post exposure bake, and developed in HFE-7300. Using a step tablet, the speed point was found to be about 3 mJ/cm² (Example 20—comparative). A suitable set of conditions was not reliably found to form an undercut structure that also lifts off. Even at an exposure of just 5 mJ/cm² (just 2 mJ/cm² above the speed point) the P=1.48, which is outside of the useful range. Films less than 1.5 μm thick with an absorbance of less than about 0.3 abs per micron have insufficient processing latitude.

The invention claimed is:

1. A method of patterning a device comprising:
   forming over a device substrate a fluorinated photopolymer layer having a lower portion proximate the device substrate and an upper portion distal the device substrate, the fluorinated photopolymer layer comprising a radiation-absorbing dye and a fluorinated photopolymer having a solubility-altering reactive group;
   exposing the photopolymer layer to patterned radiation to form exposed and unexposed areas in accordance with the patterned radiation; and
   forming a developed structure by removing unexposed areas in a developing agent comprising a first fluorinated solvent,
   wherein
   the lower portion of the exposed area of the photopolymer layer has a dissolution rate in the developing agent that is at least 5 times higher than a dissolution rate for the upper portion.

2. The method of claim 1 wherein the radiation-absorbing dye is covalently attached the fluorinated photopolymer.

3. The method of claim 1 wherein the fluorinated photopolymer is a copolymer comprising a first repeating unit having a fluorine-containing group, a second repeating unit having a solubility-altering reactive group, and a third repeating unit having a radiation-absorbing dye.

4. The method of claim 1 wherein the fluorinated photopolymer has a fluorine content of at least 10% by weight.

5. The method of claim 1 wherein the developed structure has an undercut profile.

6. The method of claim 1 further comprising treating the developed structure with a lift-off agent comprising a second fluorinated solvent.

7. A method of patterning a device comprising:
   forming over a device substrate a fluorinated photopolymer layer comprising a radiation-absorbing dye and a fluorinated photopolymer having a solubility-altering reactive group;
   exposing the photopolymer layer to patterned radiation to form an exposed photopolymer layer having exposed and unexposed areas in accordance with the patterned radiation; and
   contacting the exposed photopolymer layer with a developing agent to remove the unexposed areas, thereby forming a developed structure having a first pattern of photopolymer covering the device substrate and a complementary second pattern of uncovered substrate corresponding to the removed unexposed areas, the developing agent comprising a first fluorinated solvent,
   wherein;
   the radiation provides a total exposure dose EXP (mJ/cm²) at an exposure wavelength $\lambda_{exp}$,
   the photopolymer layer has a thickness $T_f$(μm), an absorptivity $\alpha$ (absorbance/μm) at $\lambda_{exp}$ and a speed point SP (mJ/cm²) under conditions used for the exposing and contacting with the developing agent, and
   a processing factor, P, is in a range of 0.1 to 0.95 wherein $P=[\log(EXP/SP)]/(\alpha * T_f)$.

8. The method of claim 7 wherein the radiation-absorbing dye is covalently attached the fluorinated photopolymer.

9. The method of claim 7 wherein the fluorinated photopolymer is a copolymer comprising a first repeating unit having a fluorine-containing group, a second repeating unit having a solubility-altering reactive group, and a third repeating unit having a radiation-absorbing dye.

10. The method of claim 7 wherein the fluorinated photopolymer has a fluorine content of at least 10% by weight.

11. The method of claim 7 wherein P is in a range of 0.6 to 0.92.

12. The method of claim 7 wherein the photopolymer layer has a maximum contrast greater than 5.

13. The method of claim 7 wherein $\alpha$ is at least 0.3 absorbance units/μm) at $\lambda_{exp}$.

14. The method of claim 13 wherein $T_f$ is at least 1.5 μm.

15. The method of claim 7 wherein the device is an OLED, an OTFT, a bioelectronic device or a MEMS device.

16. The method of claim 15 wherein the device is a passive matrix OLED device.

17. A fluorinated photopolymer composition, comprising:
   a fluorinated solvent;
   a radiation-absorbing dye; and
   a fluorinated photopolymer having a fluorine content of at least 10% by weight comprising one or more solubility-altering reactive groups, wherein
   a film formed from the composition has, after removal of the fluorinated solvent, an absorptivity of at least 0.3 absorbance units per μm of film thickness when measured at 365 nm, 405 nm or 436 nm.

18. The composition of claim 17 wherein the fluorinated photopolymer has a fluorine content in a range of 30 to 60% by weight.

19. The composition of claim 17 wherein the radiation-absorbing dye is covalently attached the fluorinated photopolymer.

20. The composition of claim 17 wherein the fluorinated photopolymer further comprises a branching unit.

* * * * *